United States Patent
Koyama

(10) Patent No.: US 8,890,860 B2
(45) Date of Patent: Nov. 18, 2014

(54) STEREOSCOPIC EL DISPLAY DEVICE WITH DRIVING METHOD AND EYEGLASSES

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 182 days.

(21) Appl. No.: 13/220,968

(22) Filed: Aug. 30, 2011

(65) Prior Publication Data

US 2012/0062538 A1 Mar. 15, 2012

(30) Foreign Application Priority Data

Sep. 10, 2010 (JP) .................................. 2010-203358

(51) Int. Cl.
| | |
|---|---|
| G09G 5/00 | (2006.01) |
| G06F 3/038 | (2013.01) |
| G09G 5/10 | (2006.01) |
| G09G 3/12 | (2006.01) |
| G02B 27/22 | (2006.01) |
| H01L 27/12 | (2006.01) |
| H04N 13/04 | (2006.01) |
| G09G 3/32 | (2006.01) |

(52) U.S. Cl.
CPC ............ *H04N 13/0438* (2013.01); *G02B 27/22* (2013.01); *H01L 27/12* (2013.01); *G02B 27/2264* (2013.01); *G09G 3/3208* (2013.01); *H01L 27/1225* (2013.01)
USPC ............. 345/213; 345/212; 345/36; 345/211; 345/691

(58) Field of Classification Search
CPC ........ G06T 15/00; G06T 19/00; G02B 27/22; H04N 13/00; A61M 5/427; G09G 3/3233
USPC ............ 345/213, 87, 211, 76, 92, 32, 45, 77, 345/78, 419, 690; 348/E5.01, 53, 56, 348/E13.026, 51, 674; 315/169.3; 257/59; 349/15
See application file for complete search history.

(56) References Cited

U.S. PATENT DOCUMENTS 6,608,652 B1 8/2003 Yamazaki et al.
6,730,966 B2 5/2004 Koyama
(Continued)

FOREIGN PATENT DOCUMENTS

JP 2009-031523 A 2/2009
WO WO 2010/082479 7/2010

OTHER PUBLICATIONS

Kamiya at al., "Carrier transport properties and electronic structures of amorphous oxide semiconductors: the present status,", Solid State Physics, Sep. 1, 2009, vol. 44, No.9, pp. 621-633, Agne Gijutsu Center.

*Primary Examiner* — Dwayne Bost
*Assistant Examiner* — Darlene M Ritchie
(74) *Attorney, Agent, or Firm* — Eric J. Robinson; Robinson Intellectual Property Law Office, P.C.

(57) ABSTRACT

The present invention relates to an EL display device in which a stereoscopic image is perceived and eyeglasses having a switching means with which an image for a left eye or an image for a right eye is selectively perceived. The image for the left eye and the image for the right eye are displayed in a display portion of the EL display device by holding an image signal from a signal line in a first capacitor in a first period, holding the image signal held in the first capacitor in a second capacitor to control current that flows through an emission-control transistor in a second period, and turning on a driving transistor to control light emission of a light-emitting element and holding an image signal from a signal line in the first capacitor in a third period.

12 Claims, 11 Drawing Sheets

(56) References Cited

U.S. PATENT DOCUMENTS

| | | |
|---|---|---|
| 6,982,462 B2 | 1/2006 | Koyama |
| 7,345,665 B2 * | 3/2008 | Chang .............................. 345/87 |
| 7,525,119 B2 | 4/2009 | Koyama |
| 8,017,948 B2 | 9/2011 | Koyama |
| 8,063,855 B2 * | 11/2011 | Takahara et al. ................. 345/76 |
| 8,233,258 B2 * | 7/2012 | Wei et al. ...................... 361/111 |
| 8,319,712 B2 * | 11/2012 | Nathan et al. .................... 345/77 |
| 8,378,938 B2 * | 2/2013 | Nathan et al. .................... 345/78 |
| 2001/0002703 A1 * | 6/2001 | Koyama .......................... 257/40 |
| 2003/0201729 A1 * | 10/2003 | Kimura et al. ............. 315/169.3 |
| 2005/0001215 A1 | 1/2005 | Koyama |
| 2006/0033161 A1 | 2/2006 | Koyama |
| 2007/0035484 A1 * | 2/2007 | Chang .............................. 345/76 |
| 2007/0046587 A1 * | 3/2007 | Takahara ........................ 345/76 |
| 2007/0242068 A1 * | 10/2007 | Han et al. ...................... 345/427 |
| 2008/0211976 A1 * | 9/2008 | Nam et al. ...................... 349/15 |
| 2009/0160826 A1 * | 6/2009 | Miller et al. ................... 345/204 |
| 2009/0218573 A1 | 9/2009 | Koyama |
| 2009/0244387 A1 * | 10/2009 | Lee et al. ....................... 348/674 |
| 2009/0289966 A1 * | 11/2009 | Ikeda et al. .................... 345/690 |
| 2010/0091207 A1 * | 4/2010 | Hasegawa et al. ............. 349/15 |
| 2010/0182223 A1 * | 7/2010 | Choi et al. ..................... 345/76 |
| 2010/0315494 A1 * | 12/2010 | Ha et al. ........................ 348/53 |
| 2011/0032342 A1 | 2/2011 | Kato et al. |
| 2011/0074773 A1 * | 3/2011 | Jung .............................. 345/419 |
| 2011/0298775 A1 * | 12/2011 | Mori et al. .................... 345/211 |
| 2011/0310234 A1 * | 12/2011 | Sarma et al. ................... 348/53 |
| 2012/0061674 A1 | 3/2012 | Koyama |
| 2013/0038588 A1 * | 2/2013 | Ono et al. ..................... 345/211 |

* cited by examiner

STEREOSCOPIC EL DISPLAY DEVICE WITH DRIVING METHOD AND EYEGLASSES

BACKGROUND OF THE INVENTION

1. Field of the Invention

The present invention relates to a display device. The present invention particularly relates to an EL display device, a driving method of the EL display device, and an electronic device.

2. Description of the Related Art

Display devices typified by liquid crystal display devices, ranging from large display devices such as television receivers to small display devices such as mobile phones, have been spreading. From now on, products with higher added values will be needed and are being developed. In recent years, display devices that can display stereoscopic images have been developed in order to display more realistic images.

As a method for displaying stereoscopic images, a method by which an image seen with a left eye and an image seen with a right eye are separated and visually identified using eyeglasses (such a method is also referred to as an image separation method) is suitable for viewing images on large screens because the viewing angle can be wide. The image separation method is a method in which an image for a left eye and an image for a right eye are prepared, and an image seen with a left eye of a viewer and an image seen with a right eye of the viewer are separated using eyeglasses that include a liquid-crystal shutter, a polarization filter, or a spectral filter.

Note that temporal separation of right and left images with eyeglasses including a liquid-crystal shutter is also referred to as a frame-sequential method. A display device that displays stereoscopic images by a frame-sequential method is disclosed in Patent Document 1, for example.

REFERENCE

Patent Document

[Patent Document 1] Japanese Published Patent Application No. 2009-31523

SUMMARY OF THE INVENTION

In the case where a liquid crystal display device is used as a display device that displays stereoscopic images, as disclosed in Patent Document 1, display is performed by switching between an image for a left eye and an image for a right eye. In this case, there is a problem in that normal display cannot be obtained when the reaction speed of a liquid crystal element is insufficient. Thus, an EL light-emitting element may be used as a display element included in each pixel of the display device.

In the case of displaying stereoscopic images with an EL display device including an EL element by a frame-sequential method, an EL display device 801 that switches and displays an image for a left eye and an image for a right eye and eyeglasses 802 having a switching means with which the image for the left eye or the image for the right eye is selectively perceived, which are illustrated in FIG. 11A are used. The eyeglasses 802 having a switching means operate in synchronization with display of the image for the left eye and the image for the right eye in a manner that transmission and non-transmission of liquid-crystal shutters are switched between an eyeglass 803A for a left eye and an eyeglass 803B for a right eye, so that the image for the left eye or the image for the right eye is selectively perceived. The image for the left eye perceived by a left eye of a viewer and the image for the right eye perceived by a right eye of a viewer form an image, whereby the viewer can perceive a stereoscopic image.

FIG. 11B shows a circuit diagram of a pixel in the EL display device including an EL element. A pixel 810 includes a selection transistor 811, a driving transistor 812, an EL element 813, and a capacitor 814. In the pixel 810 shown in FIG. 11B, the selection transistor 811 is turned on by a selection signal Sel from a gate line 821 which is connected to a gate of the selection transistor 811, and an image signal Sig from a signal line 822 is held in the capacitor 814. An on state or an off state of the driving transistor 812 is controlled by the image signal Sig held in the capacitor 814. A potential of a first power supply line 823 is set to VL1 and that of a second power supply line 824 is set to VL2. When VL1>VL2, current flows between a source and a drain of the driving transistor 812 and between opposite electrodes of the EL element 813 from the first power supply line 823 to the second power supply line 824, so that the light-emitting element emits light.

FIG. 11C is a timing chart showing writing operation of the image for the left eye and the image for the right eye in the EL display device and switching between the eyeglass for the left eye and the eyeglass for the right eye of the eyeglasses having a switching means. In FIG. 11C, as writing operation of the image for the left eye and the image for the right eye, writing operation of image signals to the pixels in the first to m-th rows (m is a natural number greater than or equal to 2) is shown by an arrow 831. The arrow 831 indicates that a certain period is needed for sequentially writing image signals to the pixels in the first to m-th rows.

In FIG. 11C, "B" shows a period in which an image signal for displaying black is written, "L" shows a period which an image signal of the image for the left eye is written, and "R" shows a period which an image signal of the image for the right eye is written. In addition, as for the eyeglasses having a switching means, FIG. 11C shows whether the eyeglass for the left eye and the eyeglass for the right eye transmit or do not transmit the image displayed on the EL display device, or whether transmission and non-transmission are being switched.

In FIG. 11C, one frame period includes a period for displaying the image for the left eye and a period for displaying the image for the right eye. In a display device that displays stereoscopic images, 60 or more frame periods are provided every second, so that deterioration of image quality due to flicker or the like in display of a moving image can be suppressed.

In FIG. 11C, the period for displaying the image for the left eye and the period for displaying the image for the right eye each include first to fourth periods T1 to T4. The first period T1 is a period in which image signals of "L" or "R" are written following display of black. The second period T2 is a period in which display based on the image signals of "L" or "R" is held. The third period T3 is a period in which an image signal for displaying black is written following the display based on the image signals of "L" or "R". The fourth period T4 is a period in which display based on the image signal for displaying black is held. Writing of and display based on the image signal for displaying black in the third period T3 and the fourth period T4 are performed so that the image for the left eye or the image for the right eye is not perceived in a switching period during which transmission and non-transmission of the eyeglass for the left eye and the eyeglass for the right eye are switched. When the image for the left eye or the image for the right eye is perceived in the switching period of the eyeglasses having a switching means, a display problem such as crosstalk is caused.

In order to display stereoscopic images by a frame-sequential method in the EL display device including a light-emitting element in a pixel illustrated in FIGS. 11A to 11C, it is necessary to provide a period in which black is displayed and a period in which an image signal for displaying black is written for suppressing crosstalk. As a result, a period for writing an image signal to a pixel and making a light-emitting element emit light is shortened. In order to suppress reduction in luminance of a light-emitting element due to reduction in its light-emitting period, an image signal may be corrected in advance so that luminance of the light-emitting element is increased. However, power consumption of the EL display device is increased in that case. Such increase in power consumption is particularly significant in an EL display device whose screen size is increased.

In addition, when the screen size of the EL display device is increased, particularly when the number of pixels is increased, a period in which an image signal for displaying black is sequentially written to pixels in the first to m-th rows becomes long; thus, further reduction in luminance of the EL display device is concerned. In the case of the EL display device whose screen size is increased, the electric characteristics of a transistor provided in a pixel, in which amorphous silicon is used for a semiconductor layer is insufficient; thus, polycrystalline silicon may be used. However, a transistor including polycrystalline silicon requires a crystallization step by irradiation with laser light, which causes variation in transistor characteristics, and the variation adversely affects display on the EL display device. Therefore, a transistor which does not need a laser crystallization step and includes a semiconductor layer having excellent electric characteristics such as mobility is required.

In view of the above, an object of one embodiment of the present invention is to reduce power consumption which is increased when a period for writing an image signal to a pixel and making a light-emitting element emit light is shortened, in an EL display device that displays a stereoscopic image by a frame-sequential method. In addition, an object of one embodiment of the present invention is to reduce, in an EL display device that displays a stereoscopic image by a frame-sequential method, variation in transistor characteristics among transistors which are provided in pixels of the EL display device whose screen size is increased, so as to provide an EL display device having excellent image characteristics.

One embodiment of the present invention is related to an EL display device in which a stereoscopic image is perceived with an EL display device that switches and displays an image for a left eye and an image for a right eye and eyeglasses having a switching means with which the image for the left eye or the image for the right eye is selectively perceived. The image for the left eye or the image for the right eye is displayed in a display portion of the EL display device by holding an image signal from a signal line in a first capacitor in a first period, holding the image signal held in the first capacitor in a second capacitor to control current that flows through a third transistor in a second period, and turning on a fourth transistor to control light emission of a light-emitting element and holding an image signal from the signal line in the first capacitor in a third period.

One embodiment of the present invention is an EL display device including a first transistor that includes a gate electrically connected to a scan line, a first terminal electrically connected to a signal line, and a second terminal electrically connected to a first capacitor, and makes the first capacitor hold an image signal supplied to the signal line in accordance with a signal from the scan line; a second transistor that includes a gate electrically connected to a first control line, a first terminal electrically connected to the first capacitor, and a second terminal electrically connected to a second capacitor, and makes the second capacitor hold the image signal held in the first capacitor; a third transistor that includes a gate electrically connected to one electrode of the second capacitor, a first terminal electrically connected to a first power supply line, and a second terminal to which a current is supplied in accordance with the image signal held in the second capacitor; a fourth transistor that includes a gate electrically connected to a second control line, a first terminal electrically connected to the second terminal of the third transistor, and a second terminal to which the current that flows through the third transistor is supplied; and a light-emitting element that includes a first electrode electrically connected to a second terminal of the fourth transistor and a second electrode electrically connected to a second power supply line, and emits light in accordance with the current that flows through the third transistor and the fourth transistor.

In the EL display device according to one embodiment of the present invention, the capacitance of the first capacitor may be larger than the capacitance of the second capacitor.

In the EL display device according to one embodiment of the present invention, a semiconductor layer of each of the first to fourth transistors may include an oxide semiconductor.

One embodiment of the present invention is a driving method of an EL display device including a first period in which a first transistor is turned on by a selection signal from a scan line so that an image signal from a signal line is held in a first capacitor; a second period in which a second transistor is turned on by a first control signal so that the image signal held in the first capacitor is held in a second capacitor, and current that flows between a first terminal and a second terminal of a third transistor is controlled in accordance with the image signal held in the second capacitor; and a third period in which a fourth transistor is turned on by a second control signal so that the current is supplied to a light-emitting element and light emission of the light-emitting element is controlled. In the driving method of the EL display device, a stereoscopic image is perceived with an EL display device that switches and displays an image for a left eye and an image for a right eye and eyeglasses having a switching means with which the image for the left eye or the image for the right eye is selectively perceived in synchronization with display of the image for the left eye and the image for the right eye. The image for the left eye and the image for the right eye are displayed through the first to third periods.

One embodiment of the present invention is a driving method of an EL display device including a first period in which a first transistor is turned on by a selection signal from a scan line so that an image signal from a signal line is held in a first capacitor; a second period in which a second transistor is turned on by a first control signal so that the image signal held in the first capacitor is held in a second capacitor, and current that flows between a first terminal and a second terminal of a third transistor is controlled in accordance with the image signal held in the second capacitor; and a third period in which a fourth transistor is turned on by a second control signal so that the current is supplied to a light-emitting element and light emission of the light-emitting element is controlled, and during the light emission, the first transistor is turned on by the selection signal from the scan line so that the image signal from the signal line is held in the first capacitor in the first period. In the driving method of the EL display device, a stereoscopic image is perceived with an EL display device that switches and displays an image for a left eye and an image for a right eye and eyeglasses having a switching means with which the image for the left eye or the image for the right eye is selectively perceived in synchronization with display of the image for the left eye and the image for the right eye. The image for the left eye and the image for the right eye are displayed through the first to third periods.

In an EL display device that displays a stereoscopic image by a frame-sequential method, power consumption which is increased when a period for writing an image signal to a pixel and making a light-emitting element emit light is shortened can be reduced.

DETAILED DESCRIPTION OF THE INVENTION

Figure 1A:
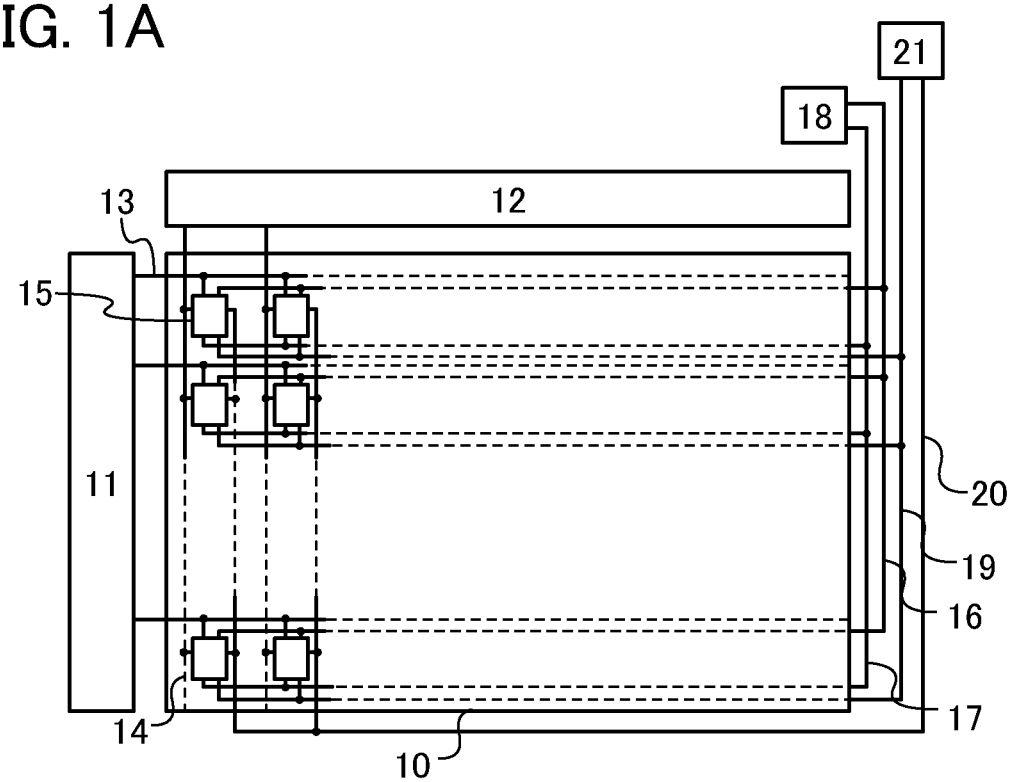
FIGS. 1A and 1B are a block diagram and a circuit diagram, respectively, for describing one embodiment of the present invention.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention is not interpreted as being limited to the description of the embodiments below. Note that identical portions or portions having the same function in all drawings illustrating the structure of the invention that are described below are denoted by the same reference numerals.

Note that the size, the thickness of a layer, or the waveform of a signal of each of structures illustrated in the drawings and the like in the embodiments is exaggerated for simplicity in some cases. Therefore, embodiments of the present invention are not limited to such scales.

Note that in this specification, terms such as "first", "second", "third", and "N-th" (N is a natural number) are used in order to avoid confusion among components and do not limit the number. The natural number is 1 or more unless otherwise specified.

Embodiment 1

In this embodiment, a structure and operation of an EL display device according to one embodiment of the present invention will be described with reference to FIGS. 1A and 1B, FIG. 2, FIGS. 3A and 3B, FIG. 4, and FIGS. 5A to 5D.

FIG. 1A is a block diagram showing a structure of an EL display device. The EL display device in FIG. 1A includes a pixel portion 10, a scan line driver circuit 11, a signal line driver circuit 12, a display control circuit 18, and a power supply circuit 21. In the pixel portion 10, a plurality of scan lines 13 whose potentials are controlled by the scan line driver circuit 11 are extended from the scan line driver circuit 11. In the pixel portion 10, a plurality of signal lines 14 whose potentials are controlled by the signal line driver circuit 12 are extended from the signal line driver circuit 12. In the pixel portion 10, a first power supply line 19 and a second power supply line 20 to which constant potentials are supplied from the power supply circuit 21 are extended from the power supply circuit 21. In the pixel portion 10, a first control line 16 and a second control line 17 whose potentials are controlled by the display control circuit 18 are extended from the display control circuit 18. The pixel portion 10 includes a plurality of pixels 15 provided in a matrix.

FIG. 1A illustrates an example in which the plurality of pixels 15 are arranged in a matrix (in stripe) in the pixel portion 10. Note that the pixels 15 are not necessarily arranged in a matrix and may be arranged in a delta pattern or Bayer arrangement. Note that color elements controlled in the pixel for color display are not limited to three colors of R (red), G (green), and B (blue), and color elements of more than three colors may be employed, for example, RGBW (W corresponds to white), or RGB added with one or more of yellow, cyan, magenta, and the like. Further, the sizes of display regions may be different between respective dots of color elements.

Figure 1B:
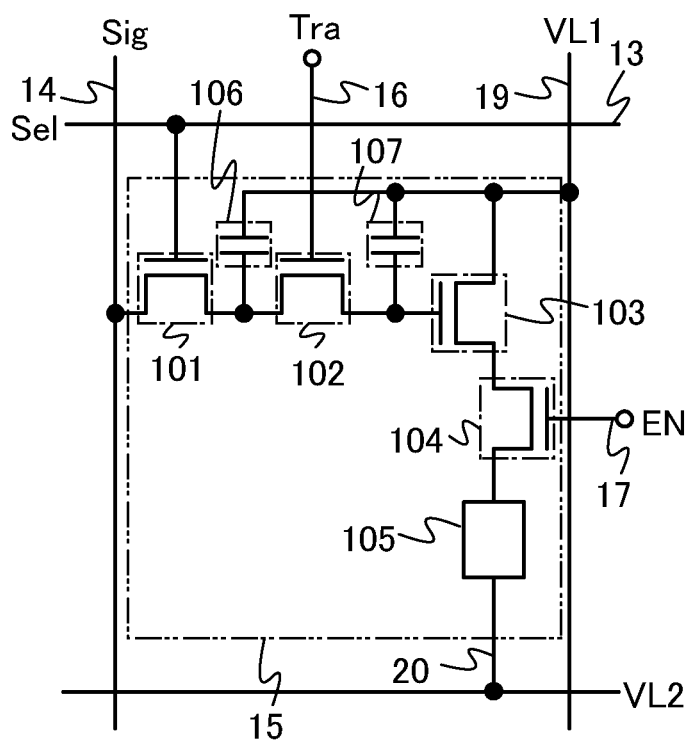
Figure 2:
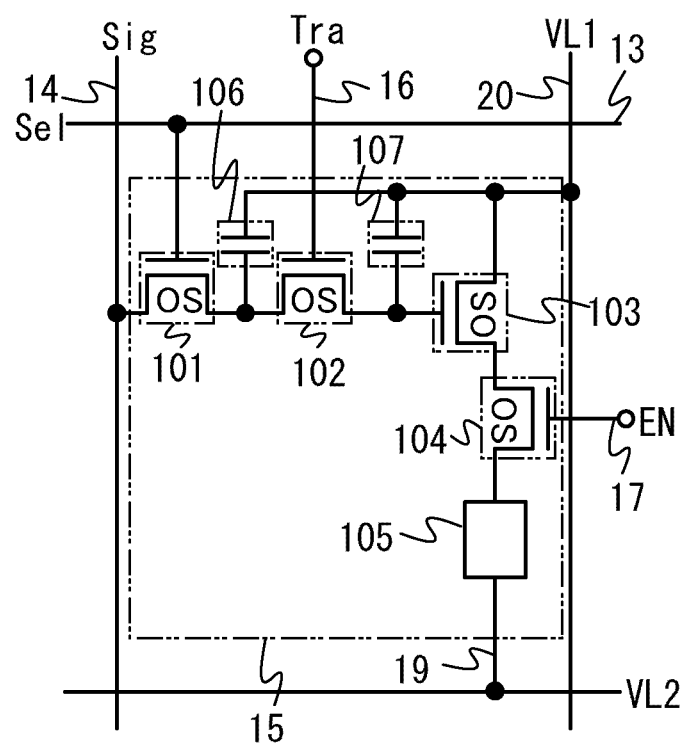
FIG. 2 is a circuit diagram for describing one embodiment of the present invention.

FIG. 1B is an example of a circuit diagram of the pixel 15 included in the EL display device illustrated in FIG. 1A. The pixel 15 illustrated in FIG. 1B includes a first transistor 101, a second transistor 102, a third transistor 103, a fourth transistor 104, a light-emitting element 105, a first capacitor 106, and a second capacitor 107.

In the pixel 15 illustrated in FIG. 1B, a gate of the first transistor 101 is connected to the scan line 13, one of a source and a drain (referred to as a first terminal) of the first transistor 101 is connected to the signal line 14, and the other of the source and the drain (referred to as a second terminal) of the first transistor 101 is connected to a first terminal of the second transistor 102 and one electrode of the first capacitor 106. The electrical continuity between the first terminal and the second terminal of the first transistor 101 is controlled by a selection signal Sel supplied to the scan line 13. In other words, the first transistor 101 functions as a switch that is turned on or turned off by the selection signal Sel. When the first transistor 101 is turned on by the selection signal Sel, a potential Sig of an image signal supplied to the signal line 14 is held in the first capacitor 106.

In the pixel 15 illustrated in FIG. 1B, a gate of the second transistor 102 is connected to the first control line 16, the first terminal of the second transistor 102 is connected to the second terminal of the first transistor 101 and the one electrode of the first capacitor 106, and a second terminal of the second transistor 102 is connected to a gate of the third transistor 103 and one electrode of the second capacitor 107. The electrical continuity between the first terminal and the second terminal of the second transistor 102 is controlled by a first control signal Tra (also referred to as a transmission control signal) supplied to the first control line 16. In other words, the second transistor 102 functions as a switch that is turned on or turned off by the first control signal Tra. When the second transistor 102 is turned on by the first control signal Tra, the potential Sig of the image signal held in the first capacitor 106 is transferred to the second capacitor 107 to be held.

In the pixel 15 illustrated in FIG. 1B, the gate of the third transistor 103 is connected to the second terminal of the second transistor 102 and the one electrode of the second capacitor 107, a first terminal of the third transistor 103 is connected to the first power supply line 19, and a second terminal of the third transistor 103 is connected to a first terminal of the fourth transistor 104. The amount of current that flows between the first terminal and the second terminal of the third transistor 103 is controlled in accordance with the potential held in the second capacitor 107. In other words, the third transistor 103 functions as a current source in which the amount of current between the first terminal and the second terminal is controlled in accordance with the potential held in the second capacitor 107.

In the pixel 15 illustrated in FIG. 1B, a gate of the fourth transistor 104 is connected to the second control line 17, the first terminal of the fourth transistor 104 is connected to the second terminal of the third transistor 103, and a second terminal of the fourth transistor 104 is connected to one electrode of the light-emitting element 105. The electrical continuity between the first terminal and the second terminal of the fourth transistor 104 is controlled by a second control signal EN (also referred to as a light-emission control signal) supplied to the second control line 17. In other words, the fourth transistor 104 functions as a switch that is turned on or turned off by the second control signal EN.

In the pixel 15 illustrated in FIG. 1B, the one electrode of the light-emitting element 105 is connected to the second terminal of the fourth transistor 104, and the other electrode of the light-emitting element 105 is connected to the second power supply line 20. The light-emitting element 105 emits light when a current for light emission of the light-emitting element 105 flows between the first terminal and the second terminal of the third transistor 103 and the fourth transistor 104 is on. The third transistor 103 functions as a current source and the fourth transistor 104 functions as a switch, whereby the light-emitting element 105 can be controlled to an emission state at a desired luminance or a non-emission state. Note that the third transistor 103, the fourth transistor 104, and the light-emitting element 105 can be connected between the first power supply line 19 and the second power supply line 20 in an order different from that in FIG. 1B.

The one electrode of the first capacitor 106 is connected to the second terminal of the first transistor 101 and the first terminal of the second transistor 102, and the other electrode of the first capacitor 106 is connected to the first power supply line 19. The one electrode of the second capacitor 107 is connected to the second terminal of the second transistor 102 and the gate of the third transistor 103, and the other electrode of the second capacitor 107 is connected to the first power supply line 19.

The display control circuit 18 is a circuit for generating various signals for displaying an image on the pixel portion 10, based on image signals supplied from the outside of the EL display device. The display control circuit 18 generates timing signals such as clock signals and start pulses for driving the scan line driver circuit 11 and the signal line driver circuit 12, in addition to the first control signal Tra and the second control signal EN.

The power supply circuit 21 is a circuit for generating a plurality of potentials that are needed in the EL display device, including the potentials supplied to the first power supply line 19 and the second power supply line 20. The power supply circuit 21 may be configured to generate a plurality of potentials based on a potential of a fixed power supply. Note that the first power supply line 19 which supplies power to each pixel may be configured to be supplied with different power supply voltages depending on the colors in the case where the driving voltages of light-emitting elements differ depending on color elements.

Note that when it is explicitly described that "A and B are connected," the case where A and B are electrically connected, the case where A and B are functionally connected, and the case where A and B are directly connected are included therein.

The capacitance of the first capacitor 106 in which a potential Sig of an image signal is held is preferably larger than that of the second capacitor 107 to which the potential of the first capacitor 106 is transferred to be held. The potential held in the second capacitor 107 is estimated from the sum of the capacitance of the first capacitor 106 and the capacitance of the second capacitor 107 when the second transistor 102 is on. Accordingly, the capacitance of the first capacitor 106 is preferably set to be greater than or equal to 10 times as large as that of the second capacitor 107. When the capacitance of the first capacitor 106 is set to be greater than or equal to 10 times as large as that of the second capacitor 107, the difference between the potential held in the second capacitor 107 and the potential held in the first capacitor 106 can be reduced.

The other electrodes of the first capacitor 106 and the second capacitor 107 are connected to the first power supply line 19; however, another structure may be employed. For example, the capacitors may be positioned to be connected to another wiring other than the first power supply line 19. Note that another wiring refers to a wiring provided to form a capacitor or a gate line connected to a pixel in the previous stage.

In this embodiment, the circuit configuration in FIG. 1B is described assuming that VL1>VL2 in the case where the potential of the first power supply line 19 is defined as VL1 and the potential of the second power supply line 20 is defined as VL2. Accordingly, when the source and the drain of each of the third transistor 103 and the fourth transistor 104 are electrically connected, current flows through the light-emitting element 105 from the first power supply line 19 to the second power supply line 20. The light-emitting element 105 emits light in accordance with the amount of current that flows therethrough. Note that the relation between the potential of the first power supply line 19 and the potential of the second power supply line 20 may be VL2>VL1. In that case, the stacking order of the light-emitting element 105 may be reversed.

Note that the first to fourth transistors 101 to 104 in this specification are transistors including a semiconductor layer including an oxide semiconductor. Specifically, the semiconductor layer may be formed using an oxide semiconductor including Zn—O, in which case the conductivity type of the transistor is n-channel type. In this specification, a transistor including a semiconductor layer including an oxide semiconductor is denoted by a symbol "OS" as in FIG. 2 so that the transistor including a semiconductor layer including an oxide semiconductor can be identified in the circuit configuration in FIG. 1B.

The first to fourth transistors 101 to 104 including a semiconductor layer including an oxide semiconductor are subjected to a step by which hydrogen in the oxide semiconductor is sufficiently reduced during a manufacturing process, so that off-state current, which refers to current that flows through a transistor in a non-conduction state (an off state), can be made extremely low. Thus, the first capacitor 106 between the first transistor 101 and the second transistor 102 and the second capacitor 107 between the second transistor 102 and the gate of the third transistor 103 can hold an image signal that is supplied for a certain period.

Note that the hydrogen concentration in the oxide semiconductor film is preferably $5\times10^{19}/cm^3$ or lower, more preferably $5\times10^{18}/cm^3$ or lower. With hydrogen in the oxide semiconductor is sufficiently reduced, a normally-on state of the transistor due to shift of a threshold voltage in the negative direction, reduction in mobility, and the like do not occur, a laser crystallization step is unnecessary, and the transistor can have a semiconductor layer having excellent electric characteristics.

Figure 3A:
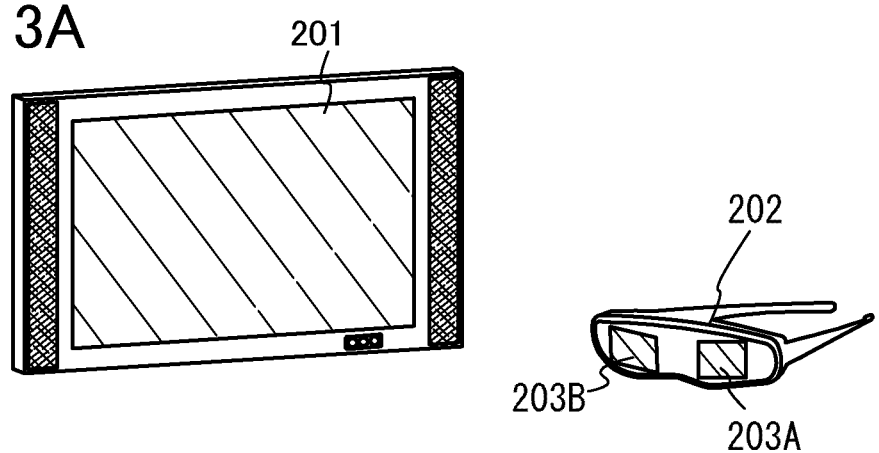
FIGS. 3A and 3B are an external view and a block diagram, respectively, for describing one embodiment of the present invention.

FIG. 3A illustrates an external view of a state where a stereoscopic image is perceived with an EL display device 201 that switches and displays an image for a left eye and an image for a right eye and eyeglasses 202 having a switching means with which the image for the left eye or the image for the right eye is selectively perceived. In the eyeglasses 202 having a switching means, shutters provided in an eyeglass 203A for a left eye and an eyeglass 203B for a right eye are alternately opened and closed. Synchronized with opening and closing of the shutters, the image for the left eye and the image for the right eye are alternately displayed on the EL display device 201. Thus, a viewer can perceive the image on the EL display device 201 as a stereoscopic image.

The shutters provided in the eyeglass 203A for the left eye and the eyeglass 203B for the right eye of the eyeglasses 202 having a switching means may be formed using a liquid crystal element in which a liquid crystal material is sandwiched between electrodes, for example. The shutter of the eyeglass 203A for the left eye or the eyeglass 203B for the right eye is opened, so that an image displayed on the EL display device 201 is guided to a left eye or a right eye of a viewer. When the shutter is closed, the image displayed on the EL display device 201 is shut out from the left eye or the right eye of the viewer.

Although FIG. 3A does not illustrate a means for electrical connection between the EL display device 201 and the eyeglasses 202 having a switching means, signals may be synchronized between the EL display device 201 and the eyeglasses 202 having a switching means by a cable or wireless signals, for example.

Figure 3B:
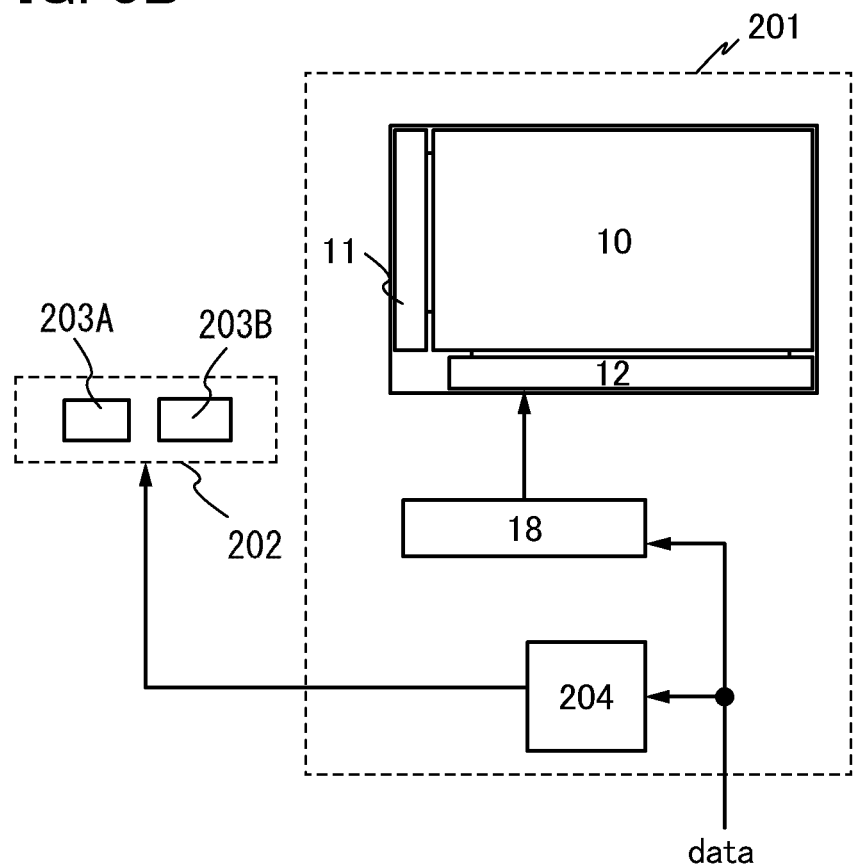

FIG. 3B shows a block diagram of main structures of the EL display device 201 and the eyeglasses 202 having a switching means.

FIG. 3B shows a block diagram of the EL display device 201 and the eyeglasses 202 having a switching means, corresponding to FIG. 3A. In FIG. 3B, the EL display device 201 includes the display control circuit 18, the pixel portion 10, the scan line driver circuit 11, the signal line driver circuit 12, and a control circuit 204 for eyeglasses having a switching means. A block diagram of the eyeglasses 202 having a switching means including the eyeglass 203A for the left eye and the eyeglass 203B for the right eye is shown in FIG. 3B.

The display control circuit 18 generates timing signals such as clock signals and start pulses for driving the scan line driver circuit 11 and the signal line driver circuit 12, in addition to the first control signal Tra and the second control signal EN, based on an image signal "data" supplied from the outside of the EL display device.

The control circuit 204 for the eyeglasses having a switching means controls opening and closing of the shutters of the eyeglass 203A for the left eye and the eyeglass 203B for the right eye of the eyeglasses 202 having a switching means in synchronization with the image for the left eye and the image for the right eye displayed on the pixel portion 10, based on an image signal "data" supplied from the outside of the EL display device. Although a means for electrical connection between the EL display device 201 and the eyeglasses 202 having a switching means is not particularly illustrated, signals between the EL display device 201 and the control circuit 204 for the eyeglasses having a switching means can be transmitted to and fro by a cable or wireless signals, for example.

In FIG. 3B, the scan line driver circuit 11 and the signal line driver circuit 12 are provided over the same substrate as the pixel portion 10; however, a structure in which one of the scan line driver circuit 11 and the signal line driver circuit 12 is provided over the same substrate as the pixel portion 10 may be employed. Alternatively, only the pixel portion 10 may be provided over the substrate.

Figure 4:
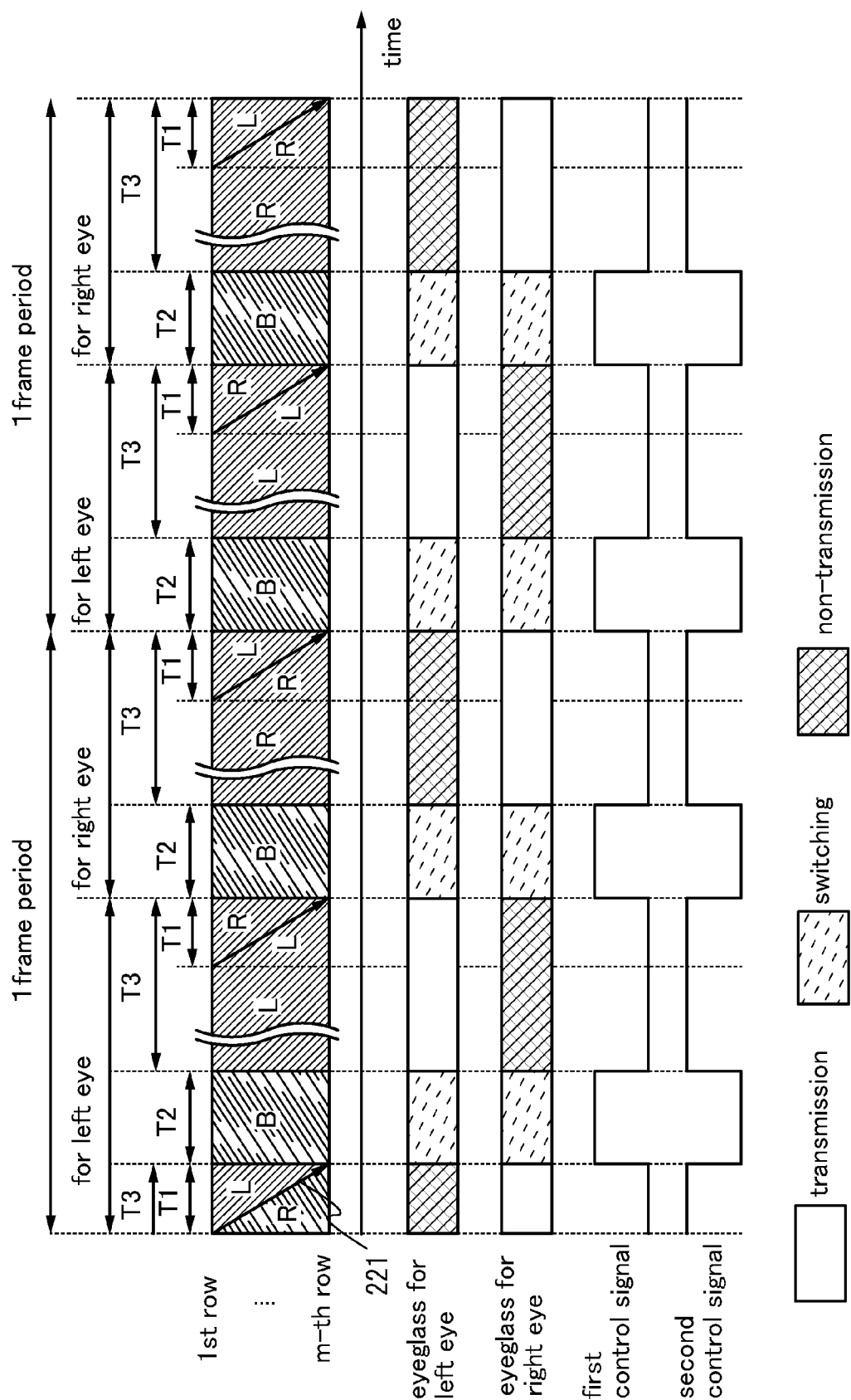
FIG. 4 is a timing chart for describing one embodiment of the present invention.

Next, writing operation of an image for a left eye and an image for a right eye in the EL display device, switching operation between the eyeglass for the left eye and the eyeglass for the right eye of the eyeglasses having a switching means, and an on state or an off state of the first to fourth transistors 101 to 104 in the pixel will be described with reference to FIG. 4 and FIGS. 5A to 5D. FIG. 4 is a timing chart showing writing operation of the image for the left eye and the image for the right eye in the EL display device, switching operation between the eyeglass for the left eye and the eyeglass for the right eye of the eyeglasses having a switching means, the first control signal Tra, and the second control signal EN. An on state or an off state of each transistor and current flow in the pixel in each period shown in the timing chart of FIG. 4 are visualized in FIGS. 5A to 5D.

In FIG. 4, as writing operation of the image for the left eye and the image for the right eye, writing operation of image signals to the pixels in the first to m-th rows (m is a natural number greater than or equal to 2) is shown by an arrow 221. The arrow 221 indicates that a certain period is needed for sequentially writing image signals to the pixels in the first to m-th rows.

In FIG. 4, "B" shows a period in which an image signal for displaying black is written, "L" shows a period which an image signal of the image for the left eye is written, and "R" shows a period which an image signal of the image for the right eye is written. In addition, as for the eyeglasses having a switching means, FIG. 4 shows whether the eyeglass for the left eye and the eyeglass for the right eye transmit or do not transmit the image displayed on the EL display device, or whether transmission and non-transmission are being switched.

In FIG. 4, one frame period includes a period for displaying the image for the left eye and a period for displaying the image for the right eye. In a display device that displays stereoscopic images, 60 or more frame periods are provided every second, so that deterioration of image quality due to flicker or the like in display of a moving image can be suppressed.

In FIG. 4, the period for displaying the image for the left eye and the period for displaying the image for the right eye each include first to third periods T1 to T3.

The first period T1 is a period in which a potential of an image signal of "L" or "R" supplied to the signal line is held in the first capacitor and in which current Idata is supplied to the light-emitting element in accordance with a potential of an image signal of "L" or "R" held in the second capacitor in the previous period. In the first period T1, the eyeglass for the left eye and the eyeglass for the right eye transmit or do not transmit light in accordance with the potential of the image signal of "L" or "R" held in the second capacitor in the previous period. Further, in the first period T1, the first control signal Tra is set to an L-level potential so that the second transistor is turned off, and the second control signal EN is set to an H-level potential so that the fourth transistor is turned on. Thus, the light-emitting element is in an emission state in this period.

Figure 5A:
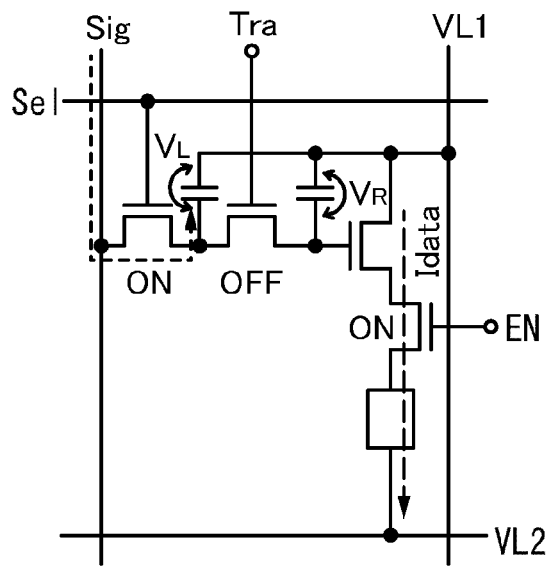
FIGS. 5A to 5D are circuit diagrams for describing one embodiment of the present invention.

In FIG. 5A, an on state or an off state of each transistor and current flow in the first period T1 are visualized. In the first period T1 shown in FIG. 5A, the first transistor is turned on by a selection signal Sel from the scan line, and an image signal $V_L$ is held in the first capacitor. In the previous period, an image signal $V_R$ is held in the second capacitor. Since the second transistor is off and the fourth transistor is on, current Idata corresponding to the image signal $V_R$ flows through the third transistor, the fourth transistor, and the light-emitting element.

The second period T2 is a period in which the potential of the image signal of "L" or "R" held in the first capacitor in the first period T1 is held in the second capacitor and in which the light-emitting element does not emit light. The second period T2 is a switching period for switching transmission or non-transmission of the eyeglass for the left eye and the eyeglass for the right eye of the eyeglasses having a switching means from the state in the first period. Further, in the second period T2, the first control signal Tra is set to an H-level potential so that the second transistor is turned on, and the second control signal EN is set to an L-level potential so that the fourth transistor is turned off. Thus, the light-emitting element is in a non-emission state in this period.

Figure 5B:
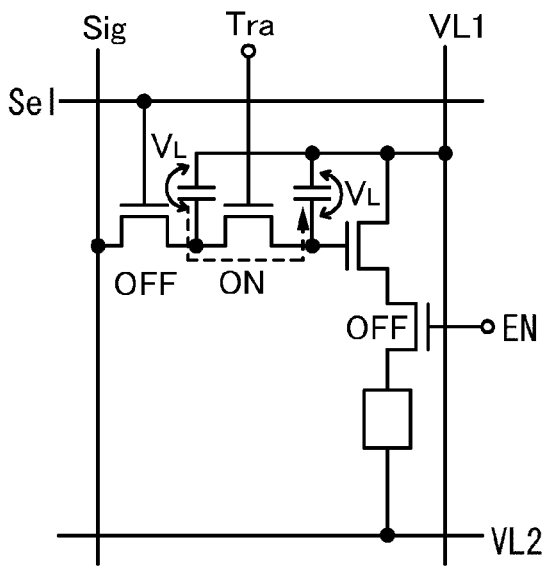

In FIG. 5B, an on state or an off state of each transistor and current flow in the second period T2 are visualized. In the second period T2 shown in FIG. 5B, the second transistor is turned on by the first control signal Tra, and the image signal $V_L$ held in the first capacitor is transferred to the second capacitor to be held. Since the fourth transistor is off at this time, current Idata corresponding to the image signal $V_L$ does not flow through the fourth transistor and the light-emitting element.

The third period T3 is a period in which current Idata flows through the light-emitting element in accordance with the potential of the image signal of "L" or "R" held in the second capacitor in the second period T2. In the third period T3, the eyeglass for the left eye and the eyeglass for the right eye of the eyeglasses having a switching means transmit or do not transmit light in accordance with the potential of the image signal of "L" or "R" held in the second capacitor in the second period T2. Further, in the third period T3, the first control signal Tra is set to an L-level potential so that the second transistor is turned off, and the second control signal EN is set to an H-level potential so that the fourth transistor is turned on. Thus, the light-emitting element is in an emission state in this period.

Figure 5C:
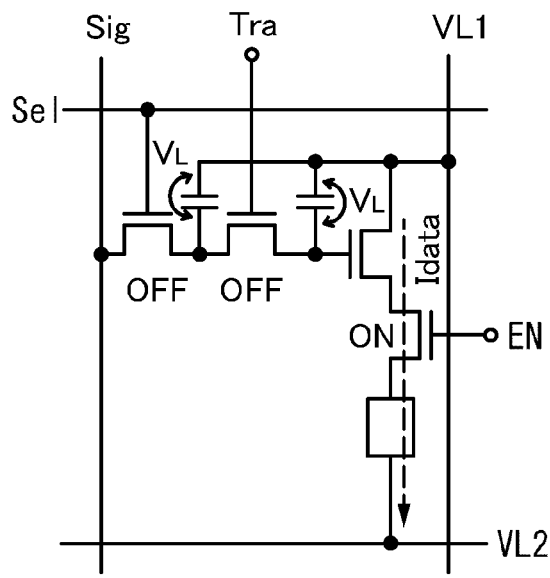

In FIG. 5C, an on state or an off state of each transistor and current flow in the third period T3 are visualized. In the third period T3 shown in FIG. 5C, the image signal $V_L$ is held in the first capacitor and the second capacitor. Since the second transistor is off and the fourth transistor is on, the current Idata corresponding to the image signal $V_L$ flows through the third transistor, the fourth transistor, and the light-emitting element.

The first period T1 may overlap with the third period T3 as shown in FIG. 4. Specifically, a potential of an image signal of "L" or "R" supplied to the signal line is held in the first capacitor at the same time as the operation of supplying current Idata to the light-emitting element in accordance with the potential of the image signal of "L" or "R" held in the second capacitor in the third period T3. Accordingly, the eyeglass for the left eye and the eyeglass for the right eye of the eyeglasses having a switching means operate in the same manner in the first period T1 and the third period T3. Similarly, the first control signal Tra and the second control signal EN operate in the same manner in the first period T1 and the third period T3. Thus, the light-emitting element is in an emission state in this period.

Figure 5D:
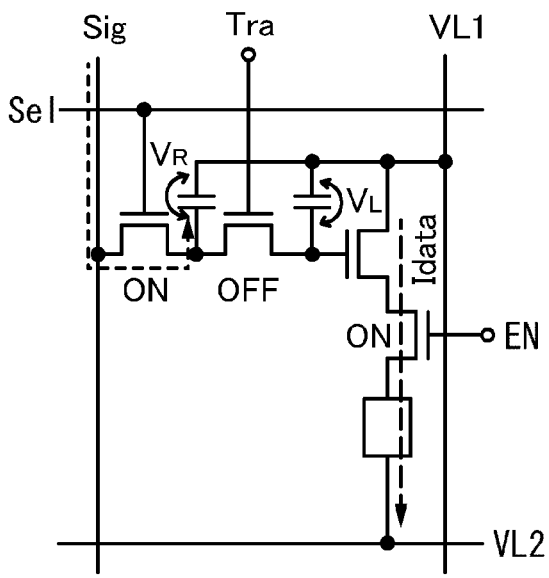

In FIG. 5D, an on state or an off state of each transistor and current flow in the first period T1 which may overlap with the third period T3 shown in FIG. 5C are visualized. In the first period T1 shown in FIG. 5D, the first transistor is turned on by a selection signal Sel from the scan line, and an image signal $V_R$ is held in the first capacitor. The image signal $V_L$ is held in the second capacitor in the third period T3 shown in FIG. 5C, which is the previous period. Since the second transistor is off and the fourth transistor is on, the current Idata corresponding to the image signal $V_L$ flows through the third transistor, the fourth transistor, and the light-emitting element.

In the first capacitor and the second capacitor in which a potential of an image signal is held, the potential of the image signal to be transferred may vary owing to switching of on and off of each transistor. In that case, it is preferable that the capacitance of the first capacitor be set to be greater than or equal to 10 times as large as that of the second capacitor, so that variation in potential is reduced.

In the case of holding a potential in the first capacitor and the second capacitor for a certain period, change in potential over time due to leakage current between the first terminal and the second terminal of each of the first transistor and the second transistor can be reduced by using a transistor including a semiconductor layer including an oxide semiconductor for each of the transistors. That is, potential can be held in the first capacitor and the second capacitor. As described above, a transistor including a semiconductor layer including an oxide semiconductor is subjected to a step by which hydrogen in the oxide semiconductor is sufficiently reduced during a manufacturing process, so that off-state current, which refers to current that flows through a transistor in a non-conduction state (an off state), can be made extremely low.

In the structure of this embodiment described using FIGS. 1A and 1B, FIG. 2, FIGS. 3A and 3B, FIG. 4, and FIGS. 5A to 5D, writing of an image signal for displaying black for suppression of crosstalk can be omitted. The switching of the eyeglass for the left eye and the eyeglass for the right eye can be performed in the period in which the potential of the image signal held in the first capacitor is transferred to the second capacitor. In the period in which the image signal is transferred, all the pixels can display black at the same time without writing of an image signal for displaying black, which is different from the case where an image signal for displaying black is sequentially written and a switching period of the eyeglasses having a switching means is provided. Thus, decrease in luminance of the EL display device can be suppressed. It takes a long time to write an image signal for displaying black to the pixels in the first to m-th rows, particularly in the case where the EL display device has a large screen size. In contrast, in the structure of this embodiment, the light-emitting elements are in a non-emission state only during the period in which image signals that are temporarily written are transferred at once, whereby decrease in luminance of the EL display device can be suppressed. As a result, increase in power consumption for increasing the luminance of the EL display device can be suppressed, whereby power consumption of the EL display device can be reduced.

In the structure of this embodiment, an image signal needs to be written to each pixel in advance in order to transfer the image signal inside the pixel. In the structure of this embodiment described above, an image signal for the next period can be written to the pixel in a period in which the light-emitting element is in an emission state. In addition, a transistor including a semiconductor layer including an oxide semiconductor is used for the transistors in the pixel in one embodiment of the present invention, so that leakage of the potential of the image signal held in the first capacitor and the second capacitor can be reduced. Thus, without complicated circuit configuration, such as providing a memory circuit and the like, the circuit operation can be realized.

As described above, according to one embodiment of the present invention, writing of an image signal for displaying black for suppressing crosstalk can be omitted in an EL display device that displays a stereoscopic image by a frame-sequential method, so that increase in power consumption due to reduction in the light-emitting period of a light-emitting element can be suppressed.

This embodiment can be implemented in appropriate combination with the structures described in the other embodiments.

Embodiment 2

In this embodiment, a structure of a light-emitting element included in each pixel of the EL display device described in the above embodiment will be described.

Figure 6:
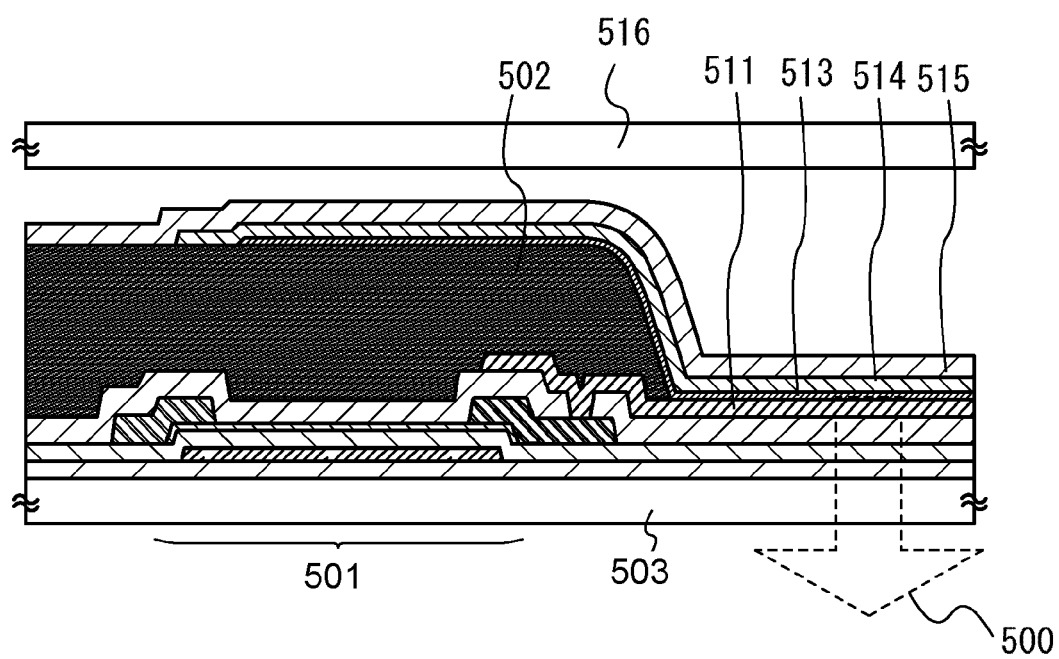
FIG. 6 is a cross-sectional view for describing one embodiment of the present invention.

FIG. 6 illustrates one embodiment of a cross-sectional structure of a light-emitting element connected to a thin film transistor. The light-emitting element is provided by a stack of a first electrode 511, an EL layer 513 including a light-emitting layer, and a second electrode 514 in this order. One of the first electrode 511 and the second electrode 514 functions as an anode and the other functions as a cathode. Holes injected from the anode and electrons injected from the cathode are recombined in the light-emitting layer included in the EL layer, whereby the light-emitting element emits light. The first electrode 511 of the light-emitting element is connected to a thin film transistor 501 formed over a substrate 503. A partition 502 is provided so as to cover the first electrode 511 and one of the electrodes serving as the source or the drain of the thin film transistor 501. The EL layer 513 is provided in an opening portion in the partition 502 over the first electrode 511. The second electrode 514 is provided so as to cover the EL layer 513 and the partition 502.

The first electrode 511 or the second electrode 514 is formed using a metal, an alloy, or a conductive compound.

For example, the first electrode 511 or the second electrode 514 can be formed using a metal, an alloy, a conductive compound, or the like that has a high work function (a work function of 4.0 eV or more). Specifically, it is possible to use a layer of a light-transmitting conductive metal oxide such as indium oxide-tin oxide (ITO: indium tin oxide), indium tin oxide containing silicon or silicon oxide, indium oxide-zinc oxide (IZO: indium zinc oxide), or indium oxide containing tungsten oxide and zinc oxide (IWZO).

Moreover, the first electrode 511 or the second electrode 514 can be formed using a metal, an alloy, a conductive compound, or the like that has a low work function (typically, a work function of 3.8 eV or less). Specifically, it is possible to use any of the following materials, for example: elements that belong to Group 1 or Group 2 of the periodic table (i.e., an alkali metal such as lithium and cesium and an alkaline-earth metal such as magnesium, calcium, and strontium) and an alloy of such an element (e.g., an alloy of aluminum, magnesium, and silver and an alloy of aluminum and lithium); and a rare earth metal (e.g., europium and ytterbium) and an alloy of such an element.

A film of an alkali metal, an alkaline-earth metal, or an alloy thereof is formed by a vacuum evaporation method, a sputtering method, or the like. Further, silver paste or the like can be applied by an inkjet method and baked to form the first electrode 511 or the second electrode 514. The first electrode 511 and the second electrode 514 are not limited to having a single-layer structure and can have a stacked-layer structure.

In order to extract light emitted from the EL layer 513 to the outside, one of or both the first electrode 511 and the second electrode 514 is/are formed so as to transmit light emitted from the EL layer 513. When only the first electrode 511 has light-transmitting properties, light passes the first electrode 511 in the direction shown by an arrow 500 and is extracted from the substrate 503 side with a luminance corresponding to a video signal input from a signal line. When only the second electrode 514 has light-transmitting properties, light passes the second electrode 514 and is extracted from a sealing substrate 516 side with a luminance corresponding to a video signal input from a signal line. When both the first electrode 511 and the second electrode 514 have light-transmitting properties, light passes the first electrode 511 and the second electrode 514 and is extracted from both the substrate 503 side and the sealing substrate 516 side with a luminance corresponding to a video signal input from a signal line.

For example, the light-transmitting electrode is formed using a light-transmitting conductive metal oxide or formed to a thickness of several nanometers to several tens of nanometers by using silver, aluminum, or the like. Alternatively, the light-transmitting electrode can have a stacked-layer structure including a thin layer of metal such as silver or aluminum and a conductive metal oxide layer with light-transmitting properties.

One of the first electrode 511 and the second electrode 514 that serves as the anode is preferably formed using a metal, an alloy, a conductive compound, or the like that has a high work function (a work function of 4.0 eV or more). The other of the first electrode 511 and the second electrode 514 that serves as the cathode is preferably formed using a metal, an alloy, a conductive compound, or the like that has a low work function (a work function of 3.8 eV or less). Typically, the electrode serving as the cathode can be formed using an alkali metal, an alkaline-earth metal, an alloy or a compound containing such a metal; or transition metal (including a rare earth metal in its category).

The EL layer 513 includes the light-emitting layer. The EL layer 513 may include a hole-injection layer, a hole-transport layer, an electron-transport layer, and an electron-injection layer in addition to the light-emitting layer. The hole-transport layer is provided between the anode and the light-emitting layer. In addition, the hole-injection layer is provided between the anode and the light-emitting layer, or between the anode and the hole-transport layer. On the other hand, the electron-transport layer is provided between the cathode and the light-emitting layer. The electron-injection layer is provided between the cathode and the light-emitting layer or between the cathode and the electron-transport layer. Note that all of the hole-injection layer, the hole-transport layer, the electron-transport layer, and the electron-injection layer are not necessarily provided, and the layer which is to be provided may be selected as appropriate in accordance with the required function or the like.

The light-emitting layer contains a light-emitting substance. As a light-emitting substance, a fluorescent compound that exhibits fluorescence or a phosphorescent compound that exhibits phosphorescence can be used, for example.

The light-emitting layer can be formed by dispersing a light-emitting substance in a host material. When the light-emitting layer is formed by dispersion of a light-emitting substance in a host material, it is possible to suppress crystallization and concentration quenching in which quenching reaction occurs between light-emitting substances.

When the light-emitting substance is a fluorescent compound, a substance having singlet excitation energy (energy difference between a ground state and a singlet excited state) higher than that of the fluorescent compound is preferably used as the host material. When the light-emitting substance is a phosphorescent compound, a substance having triplet excitation energy (the energy difference between a ground state and a triplet excited state) higher than that of the phosphorescent compound is preferably used as the host material.

As the light-emitting substance dispersed in the host material, a phosphorescent compound or a fluorescent compound can be used.

Note that for the light-emitting layer, two or more kinds of host materials and a light-emitting substance may be used, or two or more kinds of light-emitting substances and a host material may be used. Alternatively, two or more kinds of host materials and two or more kinds of light-emitting substances may be used.

As the hole-injection layer, a layer that contains a substance having a high hole-transport property and a substance having an electron-accepting property can be used. The layer which contains a substance having a high hole-transport property and a substance having an electron-accepting property has a high carrier density and an excellent hole-injection property. When the layer that contains a substance having a high hole-transport property and a substance having an electron-accepting property is used as a hole-injection layer which is in contact with an electrode that functions as an anode, any of various kinds of metals, alloys, electrically conductive compounds, mixtures thereof, and the like can be used as a material of the electrode which functions as an anode regardless of its magnitude of work function.

The light-emitting layer, the hole-injection layer, the hole-transport layer, the electron-transport layer, and the electron-injection layer can be formed by an evaporation method, a coating method, or the like.

A passivation layer 515 may be formed over the second electrode 514 and the partition 502 by a sputtering method or a CVD method. The placement of the passivation layer 515 can reduce deterioration of the light-emitting element due to entry of moisture and oxygen into the light-emitting element from the outside. A space between the passivation layer 515 and the sealing substrate 516 may be filled with nitrogen, and further, a drying agent may be placed. Alternatively, a space between the passivation layer 515 and the sealing substrate 516 may be filled with a light-transmitting organic resin with high water absorbability.

When the light-emitting element emits white light, the substrate 503 or the sealing substrate 516 can be provided with a color filter, a color conversion layer, or the like so that full-color display can be performed.

The substrate 503 or the sealing substrate 516 may be provided with a polarizing plate or a circular polarizing plate in order to enhance the contrast.

This embodiment can be implemented in appropriate combination with the structures described in the other embodiments.

Embodiment 3

In this embodiment, a structure of a transistor in the EL display device described in the above embodiment will be described.

As a structure example of a transistor, a structure of a transistor including a semiconductor layer including an oxide semiconductor (an oxide semiconductor layer) is described with reference to FIGS. 7A to 7D and FIGS. 8A and 8B. FIGS. 7A to 7D and FIGS. 8A and 8B are cross-sectional schematic views of transistors.

Figure 7A:
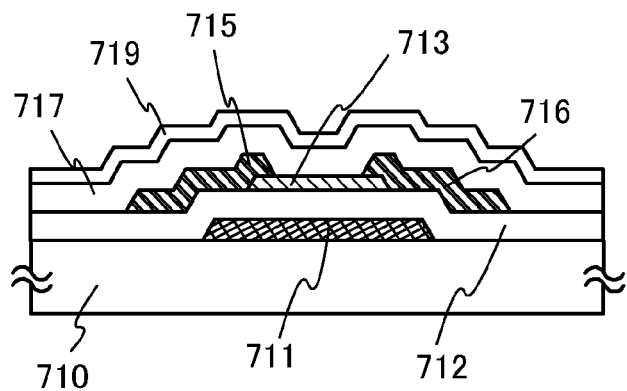
FIGS. 7A to 7D are cross-sectional views for describing one embodiment of the present invention.

A transistor in FIG. 7A is one of bottom-gate transistors and also referred to as an inverted staggered transistor.

The transistor in FIG. 7A includes a conductive layer 711 which is provided over a substrate 710, an insulating layer 712 which is provided over the conductive layer 711, an oxide semiconductor layer 713 which is provided over the conductive layer 711 with the insulating layer 712 provided therebetween, and a conductive layer 715 and a conductive layer 716 which are each provided over part of the oxide semiconductor layer 713.

Further, FIG. 7A illustrates an oxide insulating layer 717 which is in contact with the other part of the oxide semiconductor layer 713 (a portion in which the conductive layer 715 and the conductive layer 716 are not provided) of the transistor, and a protective insulating layer 719 which is provided over the oxide insulating layer 717.

Figure 7B:
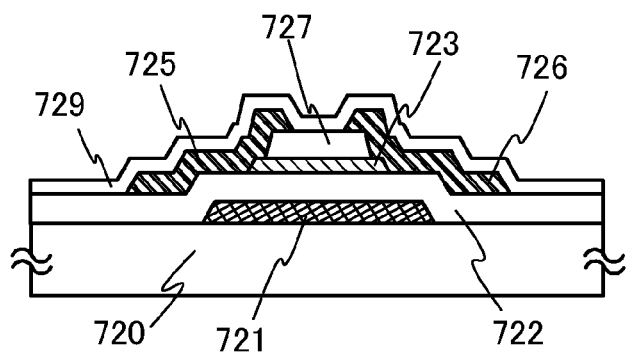

A transistor in FIG. 7B is a channel protective (also referred to as a channel stop) transistor which is one of bottom-gate transistors, and is also referred to as an inverted staggered transistor.

The transistor in FIG. 7B includes a conductive layer 721 which is provided over a substrate 720, an insulating layer 722 which is provided over the conductive layer 721, an oxide semiconductor layer 723 which is provided over the conductive layer 721 with the insulating layer 722 provided therebetween, an insulating layer 727 which is provided over the conductive layer 721 with the insulating layer 722 and the oxide semiconductor layer 723 provided therebetween, and a conductive layer 725 and a conductive layer 726 which are each provided over part of the oxide semiconductor layer 723 and part of the insulating layer 727.

Here, when part of or whole of the oxide semiconductor layer 723 overlaps the conductive layer 721, incidence of light to the oxide semiconductor layer 723 can be suppressed.

Further, FIG. 7B illustrates a protective insulating layer 729 which is provided over the transistor.

Figure 7C:
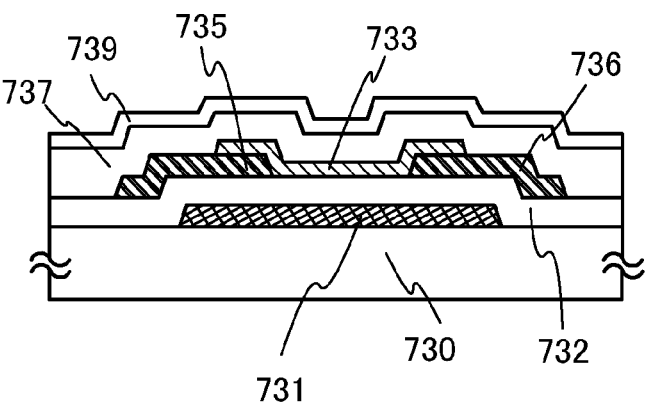

A transistor in FIG. 7C is one of bottom-gate transistors.

The transistor in FIG. 7C includes a conductive layer 731 which is provided over a substrate 730; an insulating layer 732 which is provided over the conductive layer 731; a conductive layer 735 and a conductive layer 736 which are each provided over part of the insulating layer 732; and an oxide semiconductor layer 733 which is provided over the conductive layer 731 with the insulating layer 732, the conductive layer 735, and the conductive layer 736 provided therebetween.

Here, when part of or whole of the oxide semiconductor layer 733 overlaps the conductive layer 731, incidence of light to the oxide semiconductor layer 733 can be suppressed.

Further, FIG. 7C illustrates an oxide insulating layer 737 which is in contact with a top surface and a side surface of the oxide semiconductor layer 733, and a protective insulating layer 739 which is provided over the oxide insulating layer 737.

Figure 7D:
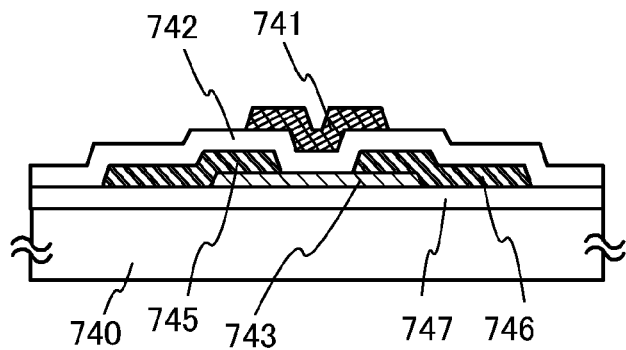

A transistor in FIG. 7D is one of top-gate transistors.

The transistor in FIG. 7D includes an oxide semiconductor layer 743 which is provided over a substrate 740 with an insulating layer 747 provided therebetween; a conductive layer 745 and a conductive layer 746 which are each provided over part of the oxide semiconductor layer 743; an insulating layer 742 which is provided over the oxide semiconductor layer 743, the conductive layer 745, and the conductive layer 746; and a conductive layer 741 which is provided over the oxide semiconductor layer 743 with the insulating layer 742 provided therebetween.

For each of the substrate 710, the substrate 720, the substrate 730, and the substrate 740, a glass substrate (e.g., a barium borosilicate glass substrate and an aluminoborosilicate glass substrate), a substrate formed of an insulator (e.g., a ceramic substrate, a quartz substrate, and a sapphire substrate), a crystallized glass substrate, a plastic substrate, a semiconductor substrate (e.g., a silicon substrate), or the like can be used.

In the transistor in FIG. 7D, the insulating layer 747 serves as a base layer preventing diffusion of an impurity element from the substrate 740. The insulating layer 747 can be formed to have a single-layer structure or a stacked-layer structure using one or more of a silicon nitride layer, a silicon oxide layer, a silicon nitride oxide layer, a silicon oxynitride layer, an aluminum oxide layer, and an aluminum oxynitride layer. Alternatively, a stacked layer of the above layer and a layer of a material having a light-blocking property is used for the insulating layer 747. Further alternatively, a layer of a material having a light-blocking property is used for the insulating layer 747. Note that when a layer of a material having a light-blocking property is used as the insulating layer 747, incidence of light to the oxide semiconductor layer 743 can be suppressed.

Note that as in the transistor in FIG. 7D, in the transistors in FIGS. 7A to 7C, the insulating layer 747 can be formed between the substrate 710 and the conductive layer 711, between the substrate 720 and the conductive layer 721, and between the substrate 730 and the conductive layer 731.

The conductive layers (the conductive layer 711, the conductive layer 721, the conductive layer 731, and the conductive layer 741) have a function as a gate of the transistor. For these conductive layers, as an example, a layer including a metal material such as molybdenum, titanium, chromium, tantalum, tungsten, aluminum, copper, neodymium, or scandium, or an alloy material which contains the metal material as a main component is used.

The insulating layers (the insulating layer 712, the insulating layer 722, the insulating layer 732, and the insulating layer 742) have a function as a gate insulating layer of the transistor.

A silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, an aluminum gallium oxide layer, or the like can be used for the insulating layers (the insulating layer 712, the insulating layer 722, the insulating layer 732, and the insulating layer 742).

As each of the insulating layers (the insulating layer 712, the insulating layer 722, the insulating layer 732, and the insulating layer 742) each of which functions as a gate insulating layer, which is in contact with the oxide semiconductor layer (the oxide semiconductor layer 713, the oxide semiconductor layer 723, the oxide semiconductor layer 733, or the oxide semiconductor layer 743), an insulating layer containing oxygen is preferably used, and more preferably, the insulating layer containing oxygen includes a region (also referred to as an oxygen excessive region) where the proportion of oxygen is higher than that in the stoichiometric composition.

When the insulating layer having a function as a gate insulating layer includes the oxygen excessive region, oxygen can be prevented from being transferred from the oxide semiconductor layer to the insulating layer having a function as a gate insulating layer. Further, oxygen can be supplied to the oxide semiconductor layer from the insulating layer having a function as a gate insulating layer. Thus, the oxide semiconductor layer in contact with the insulating layer having a function as a gate insulating layer can be a layer containing a sufficient amount of oxygen.

Furthermore, the insulating layers (the insulating layer 712, the insulating layer 722, the insulating layer 732, and the insulating layer 742) having a function as a gate insulating layer is preferably formed by using a method with which impurities such as hydrogen and water do not enter the insulating layers. The reason is as follows. When the insulating layer having a function as a gate insulating layer includes impurities such as hydrogen and water, entry of impurities such as hydrogen and water to the oxide semiconductor layers (the oxide semiconductor layer 713, the oxide semiconductor layer 723, the oxide semiconductor layer 733, and the oxide semiconductor layer 743), extraction of oxygen in the oxide semiconductor layers due to impurities such as hydrogen and water, or the like occurs. Thus, the oxide semiconductor layer might come to have low resistance (n-type conductivity) and a parasitic channel might be formed. For example, the insulating layer having a function as a gate insulating layer is formed by a sputtering method. As a sputtering gas, a high-purity gas from which impurities such as hydrogen and water are removed is preferably used.

Further, treatment for supplying oxygen is preferably performed on the insulating layer having a function as a gate insulating layer. As the treatment for supplying oxygen, heat treatment in an oxygen atmosphere, oxygen doping treatment, and the like can be given. Alternatively, oxygen may be added by performing irradiation with oxygen ions accelerated by an electric field. Note that in this specification and the like, "oxygen doping treatment" means addition of oxygen to a bulk, and the term "bulk" is used in order to clarify that oxygen is added not only to a surface of a film but also to the inside of the film. In addition, "oxygen doping" includes "oxygen plasma doping" in which oxygen which is made to be plasma is added to a bulk.

Treatment for supplying oxygen is performed on the insulating layer having a function as a gate insulating layer, so that a region where the proportion of oxygen is higher than that in the stoichiometric composition is formed in the insulating layer having a function as a gate insulating layer. Providing such a region allows oxygen to be supplied to the oxide semiconductor layer, and accordingly, oxygen defects in the oxide semiconductor layer or at the interface between the oxide semiconductor layer and the insulating layer can be reduced.

For example, in the case where an aluminum gallium oxide layer is used as the insulating layer having a function as a gate insulating layer, treatment for supplying oxygen such as oxygen doping treatment is performed; thus, the composition of aluminum gallium oxide can be $Ga_xAl_{2-x}O_{3+\alpha}$ ($0<x<2$, $0<\alpha<1$).

Alternatively, an oxygen gas or a mixed gas containing an inert gas (e.g., nitrogen or a rare gas such as argon) and oxygen is introduced when the insulating layer having a function as a gate insulating layer is formed by a sputtering method, whereby an oxygen excessive region may be formed in the insulating layer which function as a gate insulating layer. Note that after the deposition by a sputtering method, heat treatment may be performed.

The oxide semiconductor layers (the oxide semiconductor layer 713, the oxide semiconductor layer 723, the oxide semiconductor layer 733, and the oxide semiconductor layer 743) have a function as a channel formation layer of the transistor.

As an oxide semiconductor that can be used for the oxide semiconductor layer, the following metal oxides can be given: a four-component metal oxide (e.g., an In—Sn—Ga—Zn—O-based metal oxide), three-component metal oxides (e.g., an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, and a Sn—Al—Zn—O-based metal oxide), and two-component metal oxides (e.g., an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Ga—O-based metal oxide, and an In—Sn—O-based metal oxide). An In—O-based metal oxide, a Sn—O-based metal oxide, a Zn—O-based metal oxide, or the like can be used as the oxide semiconductor that can be used for the oxide semiconductor layer. Further, as the oxide semiconductor that can be used for the oxide semiconductor layer, an oxide semiconductor obtained by adding silicon oxide ($SiO_2$) to the above metal oxide can also be used.

A material represented by $InMO_3(ZnO)_m$ (m>0) can be used as the oxide semiconductor that can be used for the oxide semiconductor layer. Here, M represents one or more metal elements selected from Ga, Al, Mn, and Co. For example, M can be Ga, Ga and Al, Ga and Mn, Ga and Co, or the like.

The conductive layers (the conductive layers 715 and 716, the conductive layers 725 and 726, the conductive layers 735 and 736, and the conductive layers 745 and 746) each function as a source or a drain of the respective transistors. For example, as each of the conductive layers, a layer of a metal material such as aluminum, chromium, copper, tantalum, titanium, molybdenum, or tungsten, or an alloy material which contains any of the metal materials as its main component is used.

For example, as the conductive layer having a function as the source or the drain of the transistor, a stacked layer of a layer of a metal such as aluminum or copper, and a layer of a high-melting-point metal such as titanium, molybdenum, or tungsten is used. Alternatively, a metal material layer of aluminum or copper is provided between a plurality of high-melting-point metal layers. Heat resistance of the transistor can be improved by using an aluminum layer to which an element for preventing generation of hillocks and whiskers (e.g., silicon, neodymium, or scandium) is added as the above conductive layer.

As the material of the conductive layer, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or such a metal oxide material containing silicon oxide is used.

The insulating layer 727 has a function as a layer for protecting a channel formation layer of the transistor (also referred to as a channel protective layer).

As an example, an oxide insulating layer such as a silicon oxide layer is used for the oxide insulating layer 717 and the oxide insulating layer 737.

As an example, an inorganic insulating layer such as a silicon nitride layer, an aluminum nitride layer, a silicon nitride oxide layer, or an aluminum nitride oxide layer is used for the protective insulating layer 719, the protective insulating layer 729, and the protective insulating layer 739.

Figure 8A:
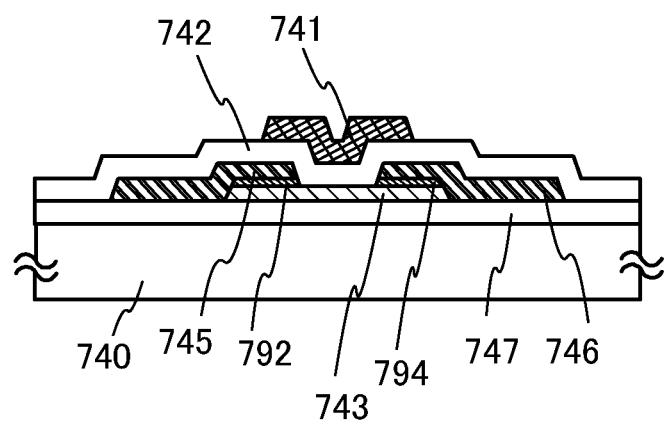
FIGS. 8A and 8B are cross-sectional views for describing one embodiment of the present invention.

An oxide conductive layer functioning as a source region and a drain region may be provided as a buffer layer between the oxide semiconductor layer 743 and the conductive layer 745 and between the oxide semiconductor layer 743 and the conductive layer 746. FIG. 8A illustrates a transistor in which an oxide conductive layer is provided for the transistor in FIG. 7D.

In the transistor in FIG. 8A, an oxide conductive layer 792 and an oxide conductive layer 794 which function as a source region and a drain region are formed between the oxide semiconductor layer 743 and the conductive layers 745 and 746 which function as the source and the drain. The transistor in FIG. 8B is an example in which the shapes of the oxide conductive layer 792 and the oxide conductive layer 794 differ depending on a manufacturing process.

In the transistor of FIG. 8A, an oxide semiconductor film and an oxide conductive film are stacked and processed in the same photolithography step into the oxide semiconductor layer 743 and an oxide conductive film each of which has an island shape. After the conductive layer 745 and the conductive layer 746 each of which functions as a source or a drain are formed over the oxide semiconductor layer 743 and the oxide conductive film, the island-shaped oxide conductive film is etched using the conductive layer 745 and the conductive layer 746 as masks, whereby the oxide conductive layer 792 and the oxide conductive layer 794 each of which functions as a source region or a drain region are formed.

Figure 8B:
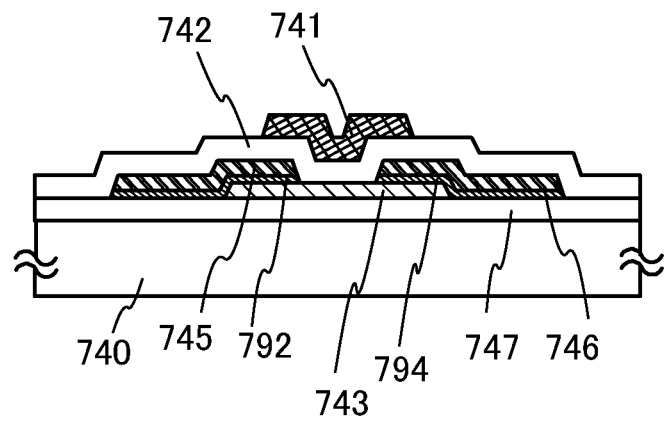

In the transistor of FIG. 8B, an oxide conductive film is formed over the oxide semiconductor layer 743, a metal conductive film is formed thereover, and the oxide conductive film and the metal conductive film are processed in the same photolithography step into the oxide conductive layer 792 and the oxide conductive layer 794 each of which functions as a source region or a drain region and the conductive layer 745 and the conductive layer 746 each of which functions as a source or a drain.

Note that in the etching treatment for processing the shape of the oxide conductive layer, etching conditions (the kind of etchant, the concentration, the etching time, and the like) are appropriately adjusted so that the oxide semiconductor layer is not excessively etched.

As the formation method of the oxide conductive layer 792 and the oxide conductive layer 794, a sputtering method, a vacuum evaporation method (e.g., an electron beam evaporation method), an arc discharge ion plating method, or a spray method is used. As a material of the oxide conductive layers, zinc oxide, zinc aluminum oxide, zinc aluminum oxynitride, zinc gallium oxide, indium tin oxide containing silicon oxide (ITSO), or the like can be used. In addition, the above materials may contain silicon oxide.

When the oxide conductive layers are each provided as a source region or a drain region between the oxide semiconductor layer 743 and the conductive layer 745 or the conductive layer 746 which functions as a source or a drain, lower resistance of the source region and the drain region can be achieved and thus the transistor can operate at high speed.

With the structure of the oxide semiconductor layer 743, the oxide conductive layer (the oxide conductive layer 792 or the oxide conductive layer 794) which functions as a drain region, and the conductive layer (the conductive layer 745 or the conductive layer 746) which function as a drain, withstand voltage of the transistor can be increased.

This embodiment can be implemented in appropriate combination with the structures described in the other embodiments.

Embodiment 4

Figure 9A:
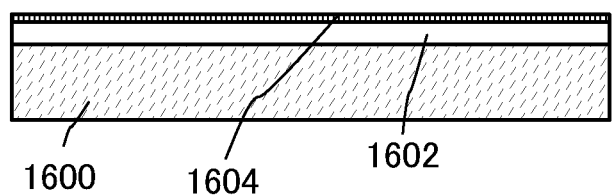
FIGS. 9A to 9C are cross-sectional views for describing one embodiment of the present invention.
Figure 9B:
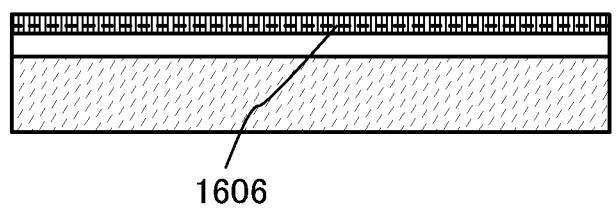

In this embodiment, an example of an oxide semiconductor which can be used for any of the semiconductor layers of the transistors described in the above embodiments will be described with reference to FIGS. 9A to 9C.

The oxide semiconductor layer of this embodiment has a structure including a first crystalline oxide semiconductor layer and a second crystalline oxide semiconductor layer which is stacked over the first crystalline oxide semiconductor layer and is thicker than the first crystalline oxide semiconductor layer.

An insulating layer 1602 is formed over an insulating layer 1600. In this embodiment, an insulating layer with a thickness greater than or equal to 50 nm and less than or equal to 600 nm is formed as the insulating layer 1602 by a PCVD method or a sputtering method. For example, a single layer selected from a silicon oxide film, a gallium oxide film, an aluminum oxide film, a silicon nitride film, a silicon oxynitride film, an aluminum oxynitride film, and a silicon nitride oxide film or a stack of any of these films can be used.

Then, a first oxide semiconductor film with a thickness of greater than or equal to 1 nm and less than or equal to 10 nm is formed over the insulating layer 1602. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or a mixed atmosphere of argon and oxygen under the following conditions: a target for an oxide semiconductor (a target for an In—Ga—Zn—O-based oxide semiconductor containing $In_2O_3$, $Ga_2O_3$, and ZnO at a ratio of 1:1:2 [molar ratio]) is used; the distance between the substrate and the target is 160 mm; the substrate temperature is 250° C.; the pressure is 0.4 Pa; and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 1604 is formed (see FIG. 9A).

Although it depends on the temperature of the first heat treatment, the first heat treatment causes crystallization from a film surface and crystal grows from the film surface toward the inside of the film; thus, c-axis aligned crystal is obtained. By the first heat treatment, a large amount of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 1602 that is an oxide insulating layer is diffused to an interface between the insulating layer 1602 and the first crystalline oxide semiconductor layer 1604 or the vicinity of the interface (within ±5 nm from the interface), whereby oxygen deficiency in the first crystalline oxide semiconductor layer 1604 is reduced. Therefore, it is preferable that oxygen be included in (in a bulk of) the insulating layer 1602 used as a base insulating layer or at the interface between the first crystalline oxide semiconductor layer 1604 and the insulating layer 1602 at an amount that exceeds at least the stoichiometric proportion.

Next, a second oxide semiconductor film is formed to a thickness greater than 10 nm over the first crystalline oxide semiconductor layer 1604. The second oxide semiconductor film is formed by a sputtering method, and the substrate temperature in the film formation is set to higher than or equal to 200° C. and lower than or equal to 400° C. When the substrate temperature at the film formation is set to higher than or equal to 200° C. and lower than or equal to 400° C., an oxide semiconductor layer which is to be formed in contact with a surface of the first crystalline oxide semiconductor layer 1604 can be ordered as a result of alignment of precursors on the oxide semiconductor layer.

In this embodiment, the second oxide semiconductor film is formed to a thickness of 25 nm in an oxygen atmosphere, an argon atmosphere, or a mixed atmosphere of argon and oxygen under the following conditions: a target for an oxide semiconductor (a target for an In—Ga—Zn—O-based oxide semiconductor containing $In_2O_3$, $Ga_2O_3$, and ZnO at a ratio of 1:1:2 [molar ratio]) is used; the distance between the substrate and the target is 170 mm; the substrate temperature is 400° C.; the pressure is 0.4 Pa; and the direct current (DC) power is 0.5 kW.

Next, second heat treatment is performed under a condition where the atmosphere of a chamber in which the substrate is set is a nitrogen atmosphere or a dry air atmosphere. The temperature of the second heat treatment is higher than or equal to 400° C. and lower than or equal to 750° C. Through the second heat treatment, a second crystalline oxide semiconductor layer 1606 is formed (see FIG. 9B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 1604 as a nucleus, that is, crystal growth proceeds from the bottom to the inside; thus, the second crystalline oxide semiconductor layer 1606 is formed.

Further, it is preferable to successively perform the step of forming the insulating layer 1602 to the step of performing the second heat treatment without exposure to the air. Through the step of forming the insulating layer 1602 to the step of performing second heat treatment, the atmosphere is preferably controlled to be an atmosphere which hardly contains hydrogen and moisture (e.g., an inert atmosphere, a reduced-pressure atmosphere, or a dry-air atmosphere); for example, a dry-nitrogen atmosphere is employed in which, as for the moisture, a dew point is lower than or equal to −40° C., preferably lower than or equal to −50° C.

Figure 9C:
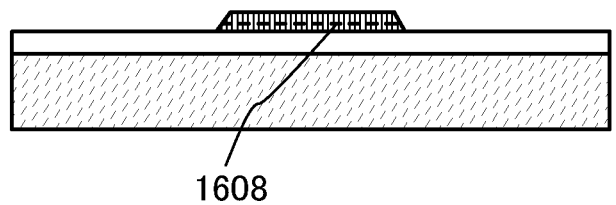

Next, the stack of the oxide semiconductor layers, the first crystalline oxide semiconductor layer 1604 and the second crystalline oxide semiconductor layer 1606, is processed into an island-shaped oxide semiconductor layer 1608 including the stack of the oxide semiconductor layers (see FIG. 9C). In the drawing, the interface between the first crystalline oxide semiconductor layer 1604 and the second crystalline oxide semiconductor layer 1606 are indicated by a dotted line, and the first crystalline oxide semiconductor layer 1604 and the second crystalline oxide semiconductor layer 1606 are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink jet method.

For the etching of the stack of the oxide semiconductor layers, either dry etching or wet etching may be employed. It is needless to say that both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as c-axis aligned crystal (CAAC)), which has neither a single crystal structure nor an amorphous structure. The first crystalline oxide semiconductor layer and the second crystalline oxide semiconductor layer partly include a crystal grain boundary.

In any case, in order to obtain CAAC, it is important to form hexagonal crystals at an initial stage of deposition of an oxide semiconductor film and to cause crystal growth from the hexagonal crystals as seeds. For that purpose, the substrate heating temperature is preferably 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, microdefects in the film and defects at the interface of a stacked layer can be compensated.

Note that the first crystalline oxide semiconductor layer and the second crystalline oxide semiconductor layer are each formed using an oxide material including at least Zn. For example, a four-component metal oxide such as an In—Al—Ga—Zn—O-based material or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, or a Zn—Mg—O-based material; a Zn—O-based material; or the like can be used. Further, an In—Si—Ga—Zn—O-based material, an In—Ga—B—Zn—O-based material, or an In—B—Zn—O-based material may be used. In addition, the above materials may contain $SiO_2$. Here, for example, an In—Ga—Zn—O-based material means an oxide film containing indium (In), gallium (Ga), and zinc (Zn), and there is no particular limitation on the composition ratio thereof. Further, the In—Ga—Zn—O-based material may contain an element other than In, Ga, and Zn.

Note that it has been pointed out that an oxide semiconductor is insensitive to impurities, there is no problem when a considerable amount of metal impurities is contained in the film, and soda-lime glass which contains a large amount of alkali metal such as sodium and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor, and therefore, is an impurity. Also, alkaline earth metal is an impurity in the case where alkaline earth metal is not included in an oxide semiconductor. Alkali metal, in particular, Na becomes $Na^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $5\times10^{19}/cm^3$, particularly less than or equal to $5\times10^{18}/cm^3$, the concentration of the above impurity is preferably reduced. Specifically, a measurement value of a Na concentration by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, a measurement value of a Li concentration is preferably less than or equal to $5\times10^{15}/cm^3$, more preferably less than or equal to $1\times10^{15}/cm^3$. In a similar manner, a measurement value of a K concentration is preferably less than or equal to $5\times10^{15}/cm^3$, more preferably less than or equal to $1\times10^{15}/cm^3$.

Without limitation to the two-layer structure in which the second crystalline oxide semiconductor layer is formed over the first crystalline oxide semiconductor layer, a stacked-layer structure of three or more layers may be formed by repeatedly performing a process of film formation and heat treatment for forming a third crystalline oxide semiconductor layer after the second crystalline oxide semiconductor layer is formed.

The oxide semiconductor layer 1608 including the stack of the oxide semiconductor layers formed by the manufacturing method described above can be used as appropriate for the transistor (e.g., the transistors described in Embodiment 2 and Embodiment 3) which can be applied to the EL display device disclosed in this specification.

Further, in the transistor of FIG. 7D of Embodiment 3, in which a stacked layer of the first crystalline oxide semiconductor layer and the second crystalline oxide semiconductor layer is used as the oxide semiconductor layer of this embodiment, an electric field is not applied from one surface of the oxide semiconductor layer to the other surface thereof. Note that in the transistor, current does not flow in the thickness direction of the stack of the oxide semiconductor layers (a direction in which a current flows from one surface to the other surface, specifically, an up and down direction in FIG. 7D). The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor film and a second crystalline oxide semiconductor film, like the oxide semiconductor layer 1608, the transistor can have stable electric characteristics and high reliability.

A transistor including polycrystalline silicon requires a crystallization step by irradiation with laser light, which causes variation in transistor characteristics. It has been a problem that the variation adversely affects display on the EL display device. However, a transistor including an oxide semiconductor described in this embodiment does not require a laser crystallization step; thus, one of factors of variation in transistor characteristics can be removed, and image quality of the EL display device can be improved.

This embodiment can be implemented in appropriate combination with the structures described in the other embodiments.

Embodiment 5

An EL display device disclosed in this specification can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices including the EL display device including a monitor circuit described in any of the above embodiments will be described.

Figure 10A:
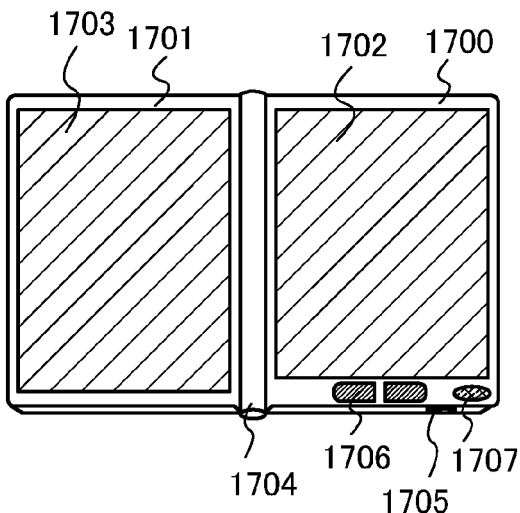
FIGS. 10A to 10D are views for describing one embodiment of the present invention.

FIG. 10A illustrates an example of an e-book reader. The e-book reader illustrated in FIG. 10A includes two housings 1700 and 1701. The housing 1700 and the housing 1701 are combined with a hinge 1704 so that the e-book reader can be opened and closed. With such a structure, the e-book reader can be operated like a paper book.

A display portion 1702 and a display portion 1703 are incorporated in the housing 1700 and the housing 1701, respectively. The display portion 1702 and the display portion 1703 may be configured to display one image or different images. In the case where the display portion 1702 and the display portion 1703 display different images, for example, a display portion on the right side (the display portion 1702 in FIG. 10A) can display text and a display portion on the left side (the display portion 1703 in FIG. 10A) can display graphics.

FIG. 10A illustrates an example in which the housing 1700 includes an operation portion and the like. For example, the housing 1700 is provided with a power supply input terminal 1705, an operation key 1706, a speaker 1707, and the like. With the operation key 1706, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as a USB cable, or the like), a recording medium insert portion, or the like may be provided on the back surface or the side surface of the housing. Further, the e-book reader illustrated in FIG. 10A may have a function of an electronic dictionary.

Figure 10B:
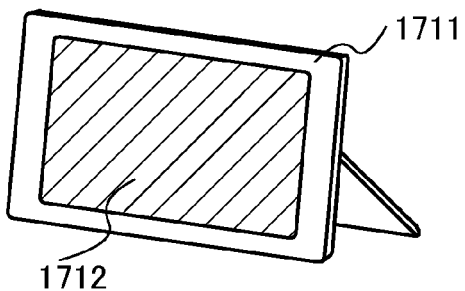

FIG. 10B shows an example of a digital photo frame including an EL display device disclosed in this specification. For example, in the digital photo frame illustrated in FIG. 10B, a display portion 1712 is incorporated in a housing 1711. The display portion 1712 can display various images. For example, the display portion 1712 can display an image taken with a digital camera or the like and function as a normal photo frame.

Note that the digital photo frame in FIG. 10B is provided with an operation portion, an external connection terminal (a USB terminal, a terminal which can be connected to a variety of cables such as a USB cable, and the like), a recording medium inserting portion, and the like. Although these components may be provided on the surface on which the display portion is provided, it is preferable to provide them on the side surface or the back surface for the design of the digital photo frame. For example, a memory that stores an image taken with a digital camera is inserted in the recording medium insertion portion of the digital photo frame, and the image can be transferred and displayed on the display portion 1712.

Figure 10C:
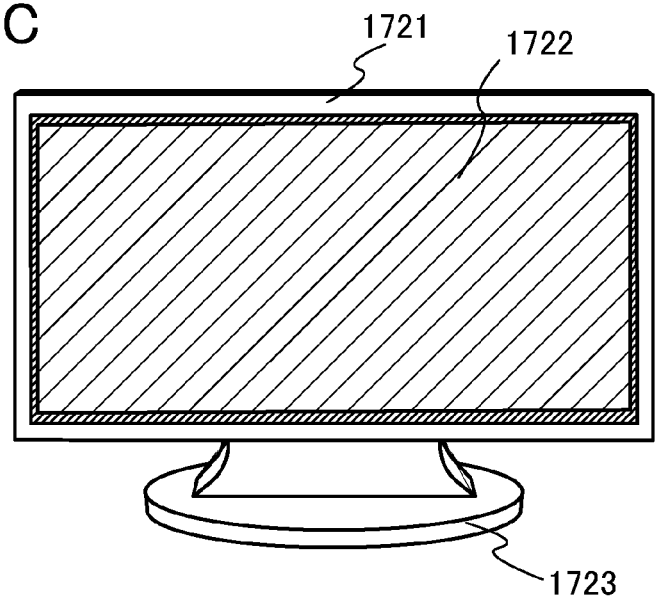

FIG. 10C illustrates an example of a television set including an EL display device. In the television set shown in FIG. 10C, a display portion 1722 is incorporated in a housing 1721. The display portion 1722 can display an image. Further, the housing 1721 is supported by a stand 1723 here. The EL display device described in any of the above embodiments can be applied to the display portion 1722.

The television set illustrated in FIG. 10C can be operated with an operation switch of the housing 1721 or a separate remote controller. Channels and volume can be controlled with an operation key of the remote controller so that an image displayed on the display portion 1722 can be controlled. Further, the remote controller may be provided with a display portion for displaying data output from the remote controller.

Figure 10D:
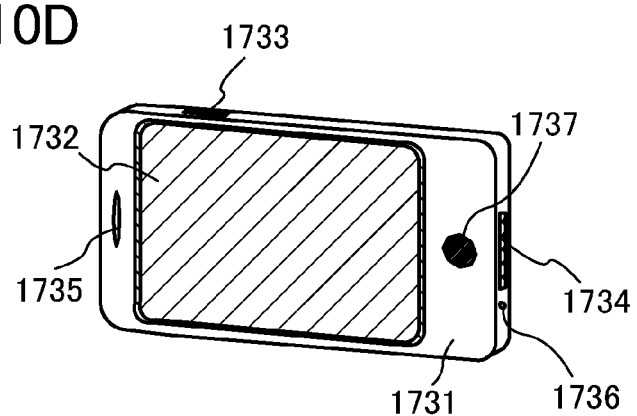
Figure 11A:
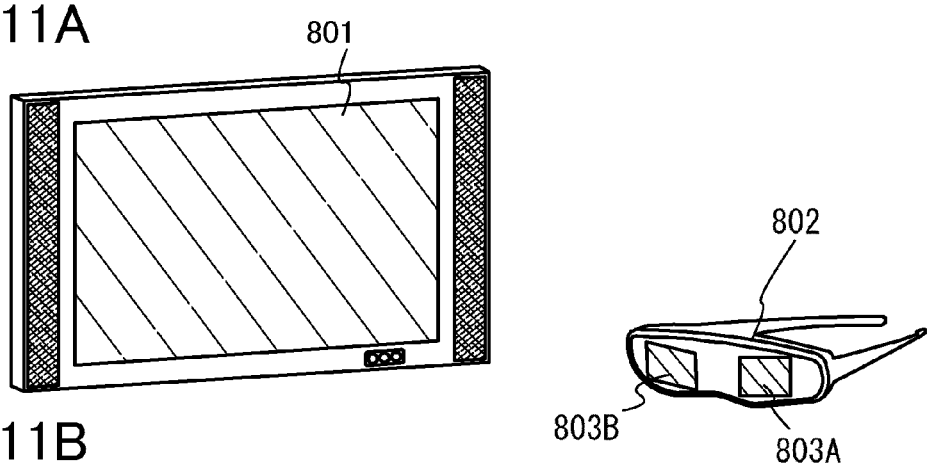
FIGS. 11A to 11C are views for describing an object of the present invention.
Figure 11B:
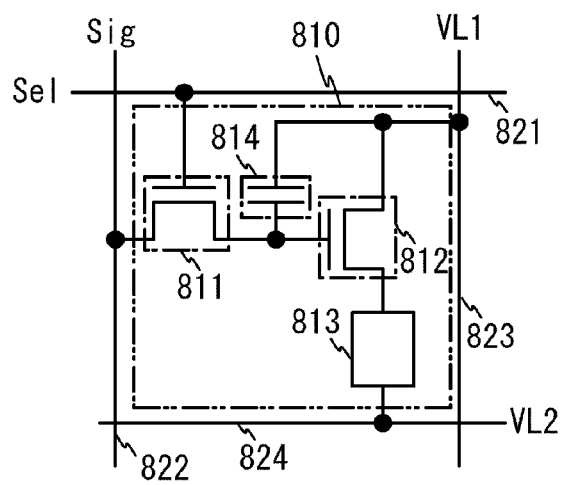
Figure 11C:
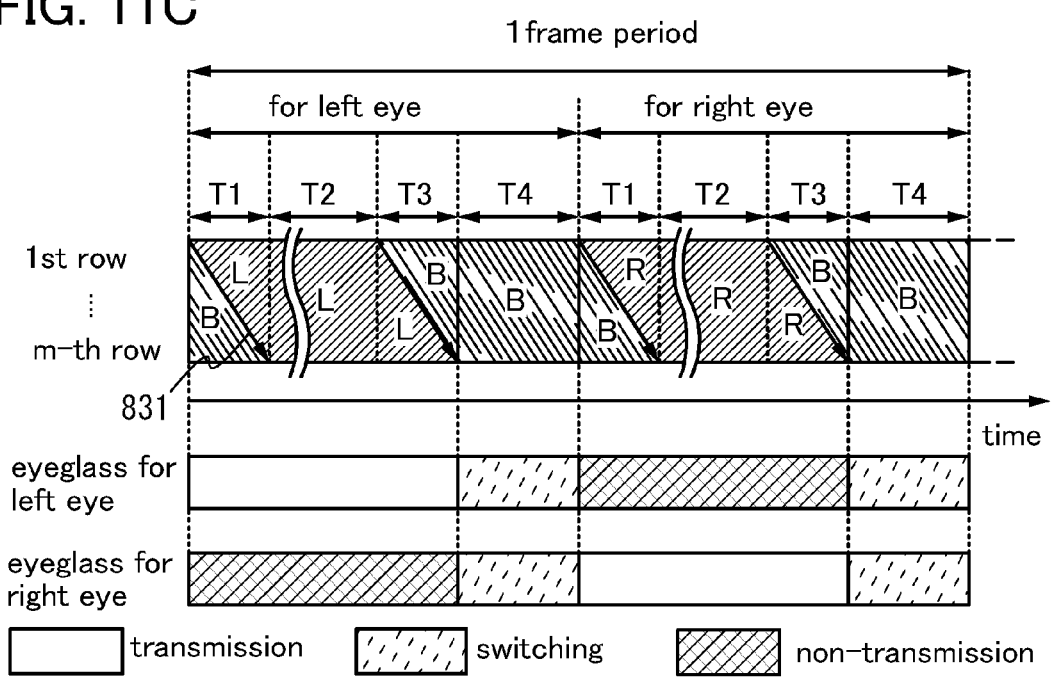

FIG. 10D shows an example of a mobile phone handset including an EL display device disclosed in this specification. The mobile phone handset illustrated in FIG. 10D includes a display portion 1732 incorporated in a housing 1731, operation buttons 1733 and 1737, an external connection port 1734, a speaker 1735, a microphone 1736, and the like.

The display portion 1732 of the mobile phone handset illustrated in FIG. 10D is a touchscreen. When the display portion 1732 is touched with a finger or the like, contents displayed on the display portion 1732 can be controlled. Further, operations such as making calls and texting can be performed by touching the display portion 1732 with a finger or the like.

This embodiment can be implemented in appropriate combination with the structures described in the other embodiments.

This application is based on Japanese Patent Application serial no. 2010-203358 filed with Japan Patent Office on Sep. 10, 2010, the entire contents of which are hereby incorporated by reference.

What is claimed is:
1. An EL display device comprising:
a first capacitor;
a first transistor comprising:
  a gate electrically connected to a scan line;
  a first terminal electrically connected to a signal line; and
  a second terminal electrically connected to the first capacitor,
wherein the first transistor is turned on by a selection signal from the scan line during a first period so that an image signal from the signal line is held in the first capacitor;
a second capacitor;
a second transistor comprising:
  a gate electrically connected to a first control line;
  a first terminal electrically connected to the first capacitor; and
  a second terminal electrically connected to the second capacitor,
wherein the second transistor is turned on by a first control signal during a second period so that the image signal held in the first capacitor is held in the second capacitor,
a third transistor comprising:
  a gate electrically connected to one electrode of the second capacitor;
  a first terminal electrically connected to a first power supply line; and a second terminal to which a current is supplied in accordance with the image signal held in the second capacitor,
a fourth transistor comprising:
a gate electrically connected to a second control line;
a first terminal electrically connected to the second terminal of the third transistor; and
a second terminal to which the same current that flows through the second terminal of the third transistor is supplied,
wherein the fourth transistor is turned on by a second control signal during a third period, and
wherein the third period overlaps the first period, and
a light-emitting element comprising:
a first electrode electrically connected to the second terminal of the fourth transistor; and
a second electrode electrically connected to a second power supply line,
wherein the light-emitting element emits light in accordance with the same current that flows through the second terminal of the third transistor and the second terminal of the fourth transistor.

2. The EL display device according to claim 1, wherein a capacitance of the first capacitor is larger than a capacitance of the second capacitor.

3. The EL display device according to claim 1, wherein each of the first to fourth transistors includes a channel formation layer comprising an oxide semiconductor.

4. An EL display device comprising:
a pixel portion;
a scan line driver circuit comprising a plurality of scan lines;
a signal line driver circuit comprising a plurality of signal lines;
a display control circuit comprising a first control line and a second control line; and
a power supply circuit comprising a first power supply line and a second power supply line,
wherein the pixel portion includes a plurality of pixels provided in a matrix, each pixel of the plurality of pixels comprises:
a first capacitor;
a first transistor comprising:
a gate electrically connected to a scan line of the plurality of scan lines;
a first terminal electrically connected to a signal line of the plurality of signal lines; and
a second terminal electrically connected to the first capacitor,
wherein the first transistor is turned on by a selection signal from the scan line during a first period so that an image signal from the signal line is held in the first capacitor;
a second capacitor;
a second transistor comprising:
a gate electrically connected to the first control line;
a first terminal electrically connected to the first capacitor; and
a second terminal electrically connected to the second capacitor,
wherein the second transistor is turned on by a first control signal during a second period so that the image signal held in the first capacitor is held in the second capacitor,
a third transistor comprising:
a gate electrically connected to one electrode of the second capacitor:
a first terminal electrically connected to the first power supply line; and
a second terminal to which a current is supplied in accordance with the image signal held in the second capacitor,
a fourth transistor comprising:
a gate electrically connected to the second control line;
a first terminal electrically connected to the second terminal of the third transistor; and
a second terminal to which the same current that flows through the second terminal of the third transistor is supplied,
wherein the fourth transistor is turned on by a second control signal during a third period, and
wherein the third period overlaps the first period, and
a light-emitting element comprising:
a first electrode electrically connected to the second terminal of the fourth transistor; and
a second electrode electrically connected to the second power supply line,
wherein the light-emitting element emits light in accordance with the same current that flows through the second terminal of the third transistor and the second terminal of the fourth transistor.

5. The EL display device according to claim 4, wherein a capacitance of the first capacitor is larger than a capacitance of the second capacitor.

6. The EL display device according to claim 4, wherein each of the first to fourth transistors includes a channel formation layer comprising an oxide semiconductor.

7. A driving method of an EL display device comprising the steps of:
turning on a first transistor by a selection signal from a scan line during a first period so that an image signal from a signal line is held in a first capacitor;
turning on a second transistor by a first control signal during a second period so that the image signal held in the first capacitor is held in a second capacitor, and a current that flows between a first terminal and a second terminal of a third transistor is controlled in accordance with the image signal held in the second capacitor; and
turning on a fourth transistor by a second control signal during a third period whereby the third period overlaps the first period so that the same current is subsequently supplied to a light-emitting element through a first terminal and a second terminal of the fourth transistor and such that light emission of the light-emitting element is controlled,
wherein a stereoscopic image is perceived with the EL display device that switches and displays an image for a left eye and an image for a right eye and eyeglasses having a switching means with which the image for the left eye or the image for the right eye is selectively perceived in synchronization with display of the image for the left eye and the image for the right eye, and
wherein the image for the left eye and the image for the right eye are displayed through the first to third periods.

8. The driving method of an EL display device according to claim 7, wherein a capacitance of the first capacitor is larger than a capacitance of the second capacitor.

9. The driving method of an EL display device according to claim 7,
wherein each of the first to fourth transistors includes a channel formation layer comprising an oxide semiconductor.

10. A driving method of an EL display device comprising the steps of:
turning on a first transistor by a selection signal from a scan line during a first period so that an image signal from a signal line is held in a first capacitor;
turning on a second transistor by a first control signal during a second period so that the image signal held in the first capacitor is held in a second capacitor, and current that flows between a first terminal and a second terminal of a third transistor is controlled in accordance with the image signal held in the second capacitor;
turning on a fourth transistor by a second control signal during a third period so that the same current is subsequently supplied to a light-emitting element through a first terminal and a second terminal of the fourth transistor and such that light emission of the light-emitting element is controlled; and
turning on the first transistor by the selection signal from the scan line during the light emission, so that the image signal from the signal line is held in the first capacitor as the first period,
wherein a stereoscopic image is perceived with the EL display device that switches and displays an image for a left eye and an image for a right eye and eyeglasses having a switching means with which the image for the left eye or the image for the right eye is selectively perceived in synchronization with display of the image for the left eye and the image for the right eye, and
wherein the image for the left eye and the image for the right eye are displayed through the first to third periods.

11. The driving method of an EL display device according to claim 10,
wherein a capacitance of the first capacitor is larger than a capacitance of the second capacitor.

12. The driving method of an EL display device according to claim 10,
wherein each of the first to fourth transistors includes a channel formation layer comprising an oxide semiconductor.

* * * * *